United States Patent
Kim et al.

(10) Patent No.: US 9,715,341 B2
(45) Date of Patent: Jul. 25, 2017

(54) OPERATING A MEMORY DEVICE USING A PROGRAM ORDER STAMP TO CONTROL A READ VOLTAGE

(71) Applicants: Kyung-Ryun Kim, Seoul (KR); Sang-Yong Yoon, Seoul (KR)

(72) Inventors: Kyung-Ryun Kim, Seoul (KR); Sang-Yong Yoon, Seoul (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 34 days.

(21) Appl. No.: 14/681,389

(22) Filed: Apr. 8, 2015

(65) Prior Publication Data

US 2016/0124641 A1    May 5, 2016

(30) Foreign Application Priority Data

Oct. 29, 2014  (KR) .................... 10-2014-0148440

(51) Int. Cl.
*G06F 3/06*     (2006.01)

(52) U.S. Cl.
CPC ............ *G06F 3/061* (2013.01); *G06F 3/0619* (2013.01); *G06F 3/0653* (2013.01); *G06F 3/0673* (2013.01)

(58) Field of Classification Search
CPC .. G06F 3/0619; G06F 3/0653; G06F 12/0246; G06F 12/0238; G06F 11/3058; G11C 7/02; G11C 5/147
See application file for complete search history.

(56) References Cited

U.S. PATENT DOCUMENTS

| 6,678,785 | B2 | 1/2004 | Lasser |
| 7,012,835 | B2 | 3/2006 | Gonzalez et al. |
| 7,649,776 | B2 | 1/2010 | Abiko et al. |
| 7,908,423 | B2 | 3/2011 | Hsu et al. |
| 8,072,805 | B2 | 12/2011 | Chou et al. |
| 8,205,033 | B2 | 6/2012 | Saeki et al. |
| 8,248,856 | B2 | 8/2012 | Goss et al. |
| 8,255,614 | B2 | 8/2012 | Omizo et al. |
| 8,264,882 | B2 | 9/2012 | Moschiano et al. |
| 8,456,911 | B2 | 6/2013 | Yuan et al. |
| 8,665,645 | B2 | 3/2014 | Avraham et al. |

(Continued)

FOREIGN PATENT DOCUMENTS

| JP | 2006133923 | 5/2006 |
| JP | 2008097705 | 4/2008 |

(Continued)

OTHER PUBLICATIONS

Desnoyers, Peter, "Analytic Modeling of SSD Write Performance", Systor '12 Jun. 4-6 2012, pp. 1-10.

*Primary Examiner* — Hal Schnee
(74) *Attorney, Agent, or Firm* — Volentine & Whitt, PLLC

(57) ABSTRACT

A method is for operating a memory system including a memory device. The method includes managing program order information of the memory device based on a program order stamp (POS) indicating a relative temporal relationship between program operations of a plurality of memory groups that are included in the memory device, and controlling a read voltage for performing a read operation on the memory device. The read voltage is controlled based on the program order information and a mapping table that stores a read voltage offset and a POS corresponding to the read voltage offset.

20 Claims, 27 Drawing Sheets

(56) References Cited

U.S. PATENT DOCUMENTS

| | | |
|---|---|---|
| 8,737,136 B2 | 5/2014 | Cometti |
| 8,743,604 B2 | 6/2014 | Chae |
| 2007/0168698 A1* | 7/2007 | Coulson ............... G11C 16/349 |
| | | 714/5.11 |
| 2009/0265403 A1 | 10/2009 | Fukumoto |
| 2012/0268994 A1 | 10/2012 | Nagashima |
| 2012/0294104 A1* | 11/2012 | Mun ....................... G11C 11/56 |
| | | 365/218 |
| 2013/0073788 A1 | 3/2013 | Post et al. |
| 2013/0159610 A1 | 6/2013 | Kawamura |
| 2014/0092682 A1 | 4/2014 | Yu et al. |
| 2014/0173172 A1 | 6/2014 | Yang et al. |
| 2014/0229131 A1* | 8/2014 | Cohen ................ G11C 16/0483 |
| | | 702/64 |
| 2014/0229774 A1 | 8/2014 | Melik-Martirosian |
| 2014/0281119 A1* | 9/2014 | Hyun .................. G06F 12/0238 |
| | | 711/102 |
| 2014/0359202 A1 | 12/2014 | Sun et al. |
| 2015/0052395 A1* | 2/2015 | Wipfel ................ G06F 11/1451 |
| | | 714/19 |
| 2015/0179284 A1* | 6/2015 | Alrod .................... G06F 11/076 |
| | | 714/704 |

FOREIGN PATENT DOCUMENTS

| | | |
|---|---|---|
| JP | 2008276832 | 11/2008 |
| JP | 2011070735 | 4/2011 |
| JP | 2011095853 | 5/2011 |
| JP | 2012123498 | 6/2012 |
| KR | 20100022229 | 3/2010 |
| KR | 2010017906 A | 11/2010 |
| KR | 20140021909 A | 2/2014 |

\* cited by examiner

FIG. 12

TABLE1

121

| ADDR | POS |
|---|---|
| 0 | 0 |
| 1 | 0 |
| 2 | 1 |
| ... | ... |
| N-1 | 0 |
| N | 0 |

⇒

122

| ADDR | POS |
|---|---|
| 0 | 29434 |
| 1 | 24679 |
| ... | ... |
| K | 30000 |
| ... | ... |
| N | 22435 |

FIG. 13

TABLE2

| POS | ADDR |
|---|---|
| 1 | 2843 |
| 2 | 173 |
| ... | ... |
| M | 27 |

| INDEX | ADDR |
|---|---|
| 0 | 10 |
| 1 | 1457 |
| 2 | 1 |
| 3 | 73 |
| 4 | 325 |
| 5 | 10 |
| ... | ... |
| M | 27 |

SI →  (pointing to index 3)

| offset | −40mV | −80mV |
|--------|-------|-------|
| POS    | 153   | 0     |

211

OPERATING A MEMORY DEVICE USING A PROGRAM ORDER STAMP TO CONTROL A READ VOLTAGE

CROSS-REFERENCE TO RELATED APPLICATION

A claim of priority is made to Korean Patent Application No. 10-2014-0148440, filed on Oct. 29, 2014, in the Korean Intellectual Property Office, the disclosure of which is incorporated herein in its entirety by reference.

BACKGROUND

The inventive concept generally relates to memory devices, and more particularly, the inventive concept relates to a memory device, a memory system, a method of operating a memory device, and a method of operating the memory system.

Memory devices that are used to store data are classified as either volatile memory devices which loss stored data in the absence of power, or nonvolatile memory devices which retain stored data in the absence of power. Flash memory devices are a popular example of a nonvolatile memory device, and are often utilized in mobile phones, digital cameras, personal digital assistants (PDAs), portable computers, fixed computers, and other devices. In order to improve the reliability of nonvolatile memory devices, it is desirable that they be controlled to operate adaptively to data retention characteristics.

SUMMARY

According to an aspect of the inventive concept, there is provided a method of operating a memory system including a memory device. The method includes managing program order information of the memory device based on a program order stamp (POS) indicating a relative temporal relationship between program operations of a plurality of memory groups that are included in the memory device, and controlling a read voltage for performing a read operation on the memory device, based on the program order information and a mapping table that stores a read voltage offset and a POS corresponding to the read voltage offset.

According to another aspect of the inventive concept, there is provided a method of operating a memory device including a plurality of memory groups. The method includes storing program order information including a program order stamp (POS) indicating a relative temporal relationship between program operations of the plurality of memory groups, storing a mapping table that stores a read voltage offset and a POS corresponding to the read voltage offset, and variably determining a read voltage for performing a read operation on the plurality of memory groups based on the mapping table and the program order information.

According to another aspect of the inventive concept, there is provided a memory system. The memory system includes a memory device including a plurality of memory groups, and a memory controller configured to control the memory device. The memory controller includes a program order manager configured to manage program order information of the memory device based on a program order stamp (POS) indicating a relative temporal relationship between program operations of the plurality of memory groups, and a mapping table generator configured to generate a mapping table that stores a read voltage offset and a POS corresponding to the read voltage offset.

According to another aspect of the inventive concept, there is provided a memory device. The memory device includes a memory cell array that includes a plurality of memory groups and is configured to store program order information that contains a program order stamp (POS) indicating a relative temporal relationship between program operations of the plurality of memory groups and to store a mapping table that stores a read voltage offset and a POS corresponding to the read voltage offset, and a read voltage determiner configured to determine a read voltage for performing a read operation on the plurality of memory groups based on the program order information and the mapping table.

BRIEF DESCRIPTION OF THE DRAWINGS

Exemplary embodiments of the inventive concept will be more clearly understood from the detailed description that follows, taken in conjunction with the accompanying drawings in which:

FIG. 12 is a table that stores program order information, according to an exemplary embodiment;

FIG. 13 is a table that stores program order information, according to another exemplary embodiment;

DETAILED DESCRIPTION OF THE EMBODIMENTS

Figure 1:
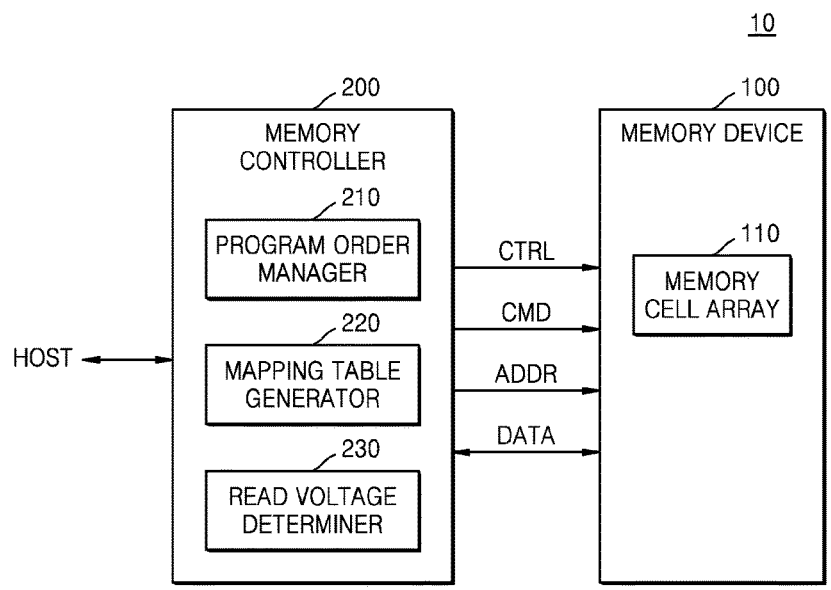
FIG. 1 is a block diagram illustrating a memory system according to an exemplary embodiment.

As used herein, the term "and/or" includes any and all combinations of one or more of the associated listed items. Expressions such as "at least one of" when preceding a list of elements, modify the entire list of elements and do not modify the individual elements of the list.

The inventive concept will now be described more fully with reference to the accompanying drawings, in which exemplary embodiments are shown. The inventive concept may, however, be embodied in many different forms and should not be construed as limited to the exemplary embodiments set forth herein. Rather, these embodiments are provided so that this disclosure will be thorough and complete, and will fully convey the scope of the inventive concept to one of ordinary skill in the art. As the inventive concept allows for various changes and numerous embodiments, exemplary embodiments will be illustrated in the drawings and described in detail in the written description. However, this is not intended to limit the inventive concept to particular modes of practice, and it is to be appreciated that all changes, equivalents, and substitutes that do not depart from the spirit and technical scope of the inventive concept are encompassed in the inventive concept. In the drawings, like reference numerals denote like elements and sizes of structures are exaggerated for clarity.

The terms used in the present specification are merely used to describe exemplary embodiments, and are not intended to limit the inventive concept. An expression used in the singular encompasses the expression of the plural, unless it has a clearly different meaning in the context. In the present specification, it is to be understood that the terms such as "including", "having," and "comprising" are intended to indicate the existence of the features, numbers, steps, actions, components, parts, or combinations thereof disclosed in the specification, and are not intended to preclude the possibility that one or more other features, numbers, steps, actions, components, parts, or combinations thereof may exist or may be added.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of exemplary embodiments.

Unless otherwise defined, all terms (including technical and scientific terms) used herein have the same meaning as commonly understood by one of ordinary skill in the art to which exemplary embodiments belong. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

FIG. 1 is a block diagram illustrating a memory system 10 according to an exemplary embodiment.

Referring to FIG. 1, the memory system 10 may include a memory device 100 and a memory controller 200. The memory device 100 may include a memory cell array 110, and the memory controller 200 may include a program order manager 210, a mapping table generator 220, and a read voltage determiner 230.

Figure 2:
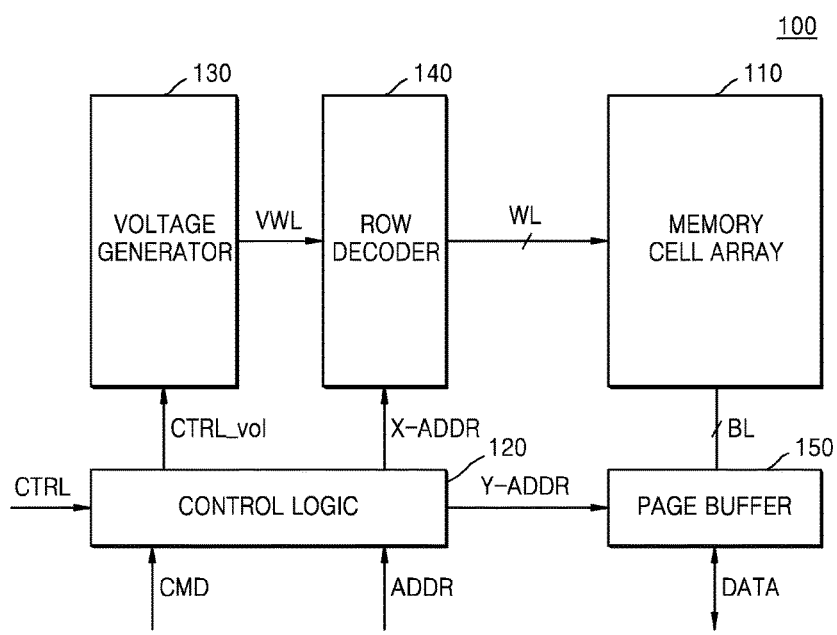
FIG. 2 is a block diagram illustrating a memory device that is included in the memory system of FIG. 1, according to an exemplary embodiment.

The memory cell array 110 may include a plurality of memory cells (not shown) that are provided at intersections between a plurality of word lines WL (see FIG. 2) and a plurality of bit lines BL (see FIG. 2). In an exemplary embodiment, the plurality of memory cells may be flash memory cells, and the memory cell array 110 may be a NAND flash memory cell array or a NOR flash memory cell array.

The exemplary embodiments described herein are explained on the assumption that the plurality of memory cells are NAND flash memory cells. In this case, for example, the plurality of memory cells may be two-dimensional (2D) horizontal NAND flash memory cells (see FIG. 4), and/or three-dimensional (3D) vertical NAND flash memory cells (see FIGS. 6 and 7). However, the inventive concept is not limited NAND flash memory, and, for example, in another exemplary embodiments the plurality of memory cells may be resistive memory cells such as resistive random-access memory (RRAM) cells, phase change RAM (PRAM) cells, or magnetic RAM (MRAM) cells.

In the present exemplary embodiment, the memory cell array 110 may be divided into a plurality of memory groups, and each of the plurality of memory groups may include a plurality of memory cells. For example, the plurality of memory groups may be divided according to memory blocks. Alternatively, the plurality of memory groups may be divided according to word lines. Alternatively, the plurality of memory groups may be divided according to pages. Alternatively, the plurality of memory groups may be divided according to dies. However, the inventive concept is not limited thereto, and, for example, the plurality of memory groups may be divided according to arbitrary program units.

In an exemplary embodiment, each of memory cells that are included in the memory cell array 110 may be a single-level cell (SLC) that stores 1-bit data. In another exemplary embodiment, each memory cell of the memory cell array 110 may be a multi-level cell (MLC) that stores 2-bit data. In another exemplary embodiment, each memory cell of the memory cell array 110 may be a triple-level cell (TLC) that stores 3-bit data. However, the inventive concept is not limited thereto, and in another exemplary embodiment, each memory cell of the memory cell array 110 may store 4 or more bits of data.

The memory controller 200 may control the memory device 100 to read data that is stored in the memory device 100 or to write data to the memory device 100 in response to a read or write request from a host HOST. Also, the memory controller 200 may control the memory device 100 to perform, for example, an operation related to a sudden power-off condition, a read reclaim operation, or a wear leveling operation according to an internal request instead of a request from the host HOST. Such a control operation may be referred to as a background operation.

In detail, the memory controller 200 may control a program (or a write) operation, a read operation, and an erase operation of the memory device 100 by applying an address ADDR, a command CMD, and a control signal CTRL to the memory device 100. Also, data DATA for a program operation and read data DATA may be transmitted/received between the memory controller 200 and the memory device 100.

The program order manager 210 may manage program order information of the memory device 100 based on a program order stamp (POS) indicating a relative temporal relationship between program operations of the plurality of memory groups. The program order information may be information about a correlation between the plurality of memory groups and POSs.

In detail, when program operations or erase operations are sequentially or simultaneously performed on the plurality of memory groups, the program order manager 210 may allocate a POS indicating an order of a program operation or an erase operation to each of the plurality of memory groups. Next, the program order manager 210 may store the memory group on which the program operation or the erase operation is performed and the POS that is newly allocated. Next, once the POS is newly allocated, the program order manager 210 may update the program order information.

In an exemplary embodiment, the program order manager 210 may sequentially store POSs according to addresses of the plurality of memory groups in order to search for the POSs according to the addresses of the plurality of memory groups. In another exemplary embodiment, the program order manager 210 may store addresses of memory groups corresponding to POSs that are sequentially increased according to the POSs that are sequentially increased in order to search for the addresses of the plurality of memory groups according to the POSs that are sequentially increased.

In an exemplary embodiment, the program order manager 210 may store a POS of each memory group in an area of the memory group in the memory cell area 110. In another exemplary embodiment, the program order manager 210 may store a POS of each memory group in a meta area in the memory cell array 110. In another exemplary embodiment, the program order manager 210 may store program order information that contains POSs of the plurality of memory groups in a meta area in the memory cell array 110. In another exemplary embodiment, the program order manager 210 may temporarily store program order information that contains POSs of the plurality of memory groups in a buffer memory (not shown) in the memory controller 200.

In the present exemplary embodiment, since program order information is stored in the memory device 100 as described above, the program order information may be retained as nonvolatile data. Accordingly, the program order information may be retained even when power supply to the memory system 10 is cut off, thereby further improving the performance and reliability of the memory device 100. Also, according to the present exemplary embodiment, since the program order information is temporarily stored in the memory controller 200 as described above, a speed at which the memory system 10 operates may be further increased.

The mapping table generator 220 may generate a mapping table that stores a read voltage offset and a POS corresponding to the read voltage offset. The term 'read voltage offset' may refer to an offset in a read voltage that is initially set, that is, an offset from a default level, in order to perform a read operation on the memory device 100. The term 'POS corresponding to the read voltage offset' may refer to a POS that is allocated to a memory group whose read-out succeeds when a read operation is performed by using a read voltage to which the read voltage offset is applied.

When a specific event for the memory device 100 occurs, the mapping table generator 220 may generate or update the mapping table by using a result of the specific event. For example, when a read-out fails after a read operation is performed on the memory device 100, the mapping table generator 220 may generate or update the mapping table by using a result of the read operation. Alternatively, when a read retry operation for searching for a valley between adjacent two distributions is performed on the memory device 100, the mapping table generator 220 may generate or update the mapping table by using a result of the read retry operation.

In an exemplary embodiment, the mapping table may further store an address of a memory group corresponding to each POS. For example, when the memory groups are divided according to memory blocks, the mapping table may store a read voltage offset, a POS corresponding to the read voltage offset, and an address of a memory block corresponding to the POS. Alternatively, when the memory groups are divided according to word lines, the mapping table may store a read voltage offset, a POS corresponding to the read voltage offset, an address of a memory block corresponding to the POS, and an address, that is, an index, of a corresponding word line corresponding to the address of the memory block.

The mapping table may be managed according to dies, memory blocks, word lines, pages, or data types. In an exemplary embodiment, the mapping table may be managed according to each of a plurality of dies that are included in the memory cell array 110, and in another exemplary embodiment, the mapping table may be collectively managed according to the plurality of dies that are included in the memory cell array 110. In an exemplary embodiment, the mapping table may be managed according to each of a plurality of pages, and in another exemplary embodiment, the mapping table may be collectively managed according to the plurality of pages. In an exemplary embodiment, the mapping table may be managed according to each of data types, that is, data according to a request from a host and data according to a background operation, and in another exemplary embodiment, the mapping table may be collectively managed according to the data according to the request from the host and the data according to the background operation. In an exemplary embodiment, the mapping table may be managed by the number of active memory blocks.

In an exemplary embodiment, the mapping table may be stored in an area of each memory group in the memory cell array 110. In another exemplary embodiment, the mapping table may be stored in a meta area in the memory cell array 110. In another exemplary embodiment, the mapping table may be temporarily stored in a buffer memory (not shown) in the memory controller 200.

In an exemplary embodiment, the mapping table generator 220 may store in the mapping table a read voltage offset and a POS corresponding to the read voltage offset in a one-to-one manner. In another exemplary embodiment, the mapping table generator 220 may store in the mapping table the read voltage offset and the POS corresponding to the read voltage offset in an inequality manner. A detailed operation of the mapping table generator 220 will be explained below with reference to FIGS. 16 through 22.

The read voltage determiner 230 may variably determine a read voltage for performing a read operation on the memory device 100 based on the mapping table and the program order information. For example, when a read request from the host is received or a read command for the memory device 100 is generated, an operation of the read voltage determiner 230 may be initialized. In detail, the read voltage determiner 230 may search for a POS corresponding to a memory group to be read from among the plurality of memory groups based on the program order information, may search for a read voltage offset corresponding to the searched POS, and may perform a read operation on the memory group by using the searched read voltage offset.

In an exemplary embodiment, the memory groups may be divided according to memory blocks. When read operations of a first address and a second address that are included in the same memory block are sequentially performed, the read voltage determiner 230 may determine a read voltage of the first address by referring to the program order information. In contrast, the read voltage determine 230 may determine a read voltage of the second address to be the same as the read voltage of the first address, without referring to the program order information.

In another exemplary embodiment, the memory groups may be divided according to word lines. When read operations of a first page and a second page that are connected to the same word line are sequentially performed, the read voltage determiner 230 may determine a read voltage of the first page by referring to the program order information. In contrast, the read voltage determiner 230 may determine a read voltage of the second page to be the same as the read voltage of the first page, without referring to the program order information.

FIG. 2 is a detailed block diagram illustrating the memory device 100 that is included in the memory system 10 of FIG. 1, according to an exemplary embodiment.

Referring to FIG. 2, the memory device 100 may include the memory cell array 110, a control logic 120, a voltage generator 130, a row decoder 140, and a page buffer 150. Although not shown in FIG. 2, the memory device 100 may further include an input/output circuit or an input/output interface. Elements that are included in the memory device 100 will now be explained in detail.

The memory cell array 110 may be connected to the plurality of word lines WL and the plurality of bit lines BL. Although not shown in FIG. 2, the memory cell array 110 may be connected to at least one string selection line SSL and at least one ground selection line GSL. The memory cell array 110 may include a plurality of memory cells (MC of FIG. 4 or MC1 through MC8 of FIG. 6) that are provided at intersections between the plurality of word lines WL and the plurality of bit lines BL. Each of the plurality of memory cells may store 1-bit data or multi-bit data.

When an erase voltage is applied to the memory cell array 110, the plurality of memory cells MC change to an erase state, and when a program voltage is applied to the memory cell array 110, the plurality of memory cells MC change to a program state. In this case, each of the memory cells MC may have an erase state E and at least one program state that are determined according to a threshold voltage Vth.

In an exemplary embodiment, when the memory cell MC is a single-level cell, the memory cell MC may have a threshold voltage corresponding to one of an erase state E and a program state P. In another exemplary embodiment, when the memory cell MC stores more than 1 bit, the memory cell MC may have a threshold voltage corresponding to one of an erase state E and first through nth program states P1 through Pn, where n may be a natural number equal to or greater than 3. In an exemplary embodiment, when the memory cell MC is a multi-level cell storing 2 bits, n is 3. In another exemplary embodiment, when the memory cell MC is a triple-level cell storing 3 bits, n is 7. However, the inventive concept is not limited to these examples.

The memory cell array 110 may include at least one selected from a single-level cell block including single-level cells, a multi-level cell block including multi-level cells, and a triple-level cell block including triple-level cells. In other words, some memory blocks from among the plurality of memory blocks that are included in the memory cell array 110 may be single-level cell blocks and other memory blocks may be multi-level cell blocks or triple-level cell blocks.

The control logic 120 may output various control signals for writing data to the memory cell array 110 or reading data from the memory cell array 110 based on the command CMD, the address ADDR, and the control signal CTRL that are received from the memory controller 200. Accordingly, the control logic 120 may generally control various operations in the memory device 100.

The various control signals that are output from the control logic 120 may be applied to the voltage generator 130, the row decoder 140, and the page buffer 150. In detail, the control logic 120 may apply a voltage control signal CTRL_vol to the voltage generator 130, a row address X_ADDR to the row decoder 140, and a column address Y_ADDR to the page buffer 150. However, the inventive concept is not limited thereto, and the control logic 120 may further apply other control signals to the voltage generator 130, the row decoder 140, and the page buffer 150.

The voltage generator 130 may generate various types of voltages for performing a program operation, a read operation, and an erase operation on the memory cell array 110 based on the voltage control signal CTRL_vol. In detail, the voltage generator 130 may generate a word line driving voltage VWL for driving the plurality of word lines WL. In this case, the word line driving voltage VWL may be a program voltage (or a write voltage), a read voltage, an erase voltage, an inhibit voltage, or a program verify voltage.

Although not shown in FIG. 2, the voltage generator 130 may further generate a string selection line driving voltage VSSL for driving the plurality of string selection lines SSL and a ground selection line driving voltage VGSL for driving the plurality of ground selection lines GSL.

The row decoder 140 may be connected to the memory cell array 110 through the plurality of word lines WL, and may activate some word lines from among the plurality of word lines WL in response to the row address X_ADDR that is received from the control logic 120. In detail, during a read operation, the row decoder 140 may apply a read voltage to a selected word line and may apply an inhibit voltage to a non-selected word line. Also, during a program operation, the row decoder 140 may apply a program voltage to a selected word line and may apply an inhibit voltage to a non-selected word line.

The page buffer 150 may be connected to the memory cell array 110 through the plurality of bit lines BL. In detail, during a read operation, the page buffer 150 may output the data DATA that is stored in the memory cell array 110 by operating a sense amplifier. During a program operation, the page buffer 150 may input the data DATA to be stored to the memory cell array 110 by operating a write driver.

Figure 3:
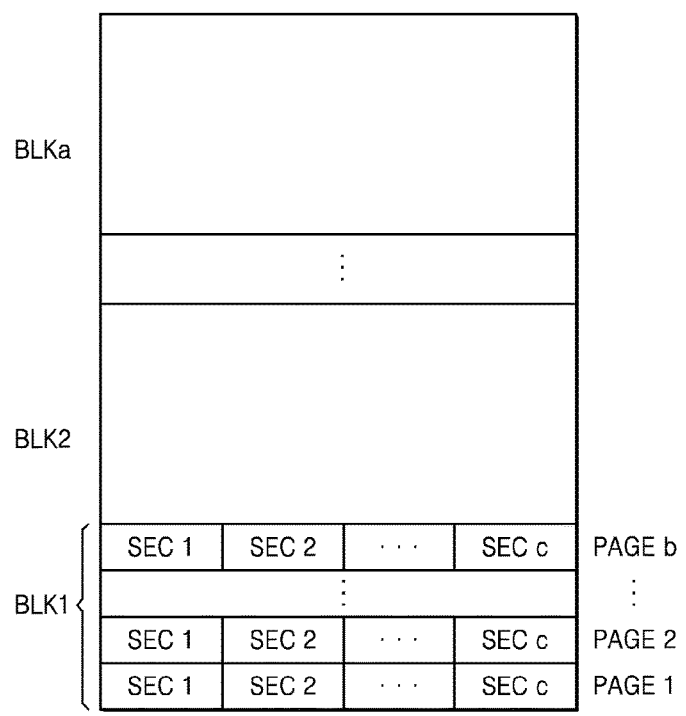
FIG. 3 is a diagram illustrating a memory cell array that is included in the memory device of FIG. 2, according to an exemplary embodiment.

FIG. 3 is a diagram illustrating the memory cell array 110 that is included in the memory device 100 of FIG. 2, according to an exemplary embodiment.

Referring to FIG. 3, the memory cell array 110 may be a flash memory cell array. In this case, the memory cell array 110 may include a (a is an integer equal to or greater than 2) memory blocks, that is, first through ath memory blocks BLK1 through BLKa, each of the first through ath memory blocks BLK1 through BLKa may include b (b is an integer equal to or greater than 2) pages PAGE1 through PAGEb, and each of the pages PAGE1 through PAGEb may include c (c is an integer equal to or greater than 2) sectors SEC1 through SECc. Although the pages PAGE1 through PAGEb and the sectors SEC1 through SECc of only the first memory block BLK1 are shown in FIG. 3 for convenience, the other memory blocks, that is, the second through ath memory blocks BLK2 through BLKa, may have the same structures as that of the first memory block BLK1.

Figure 4:
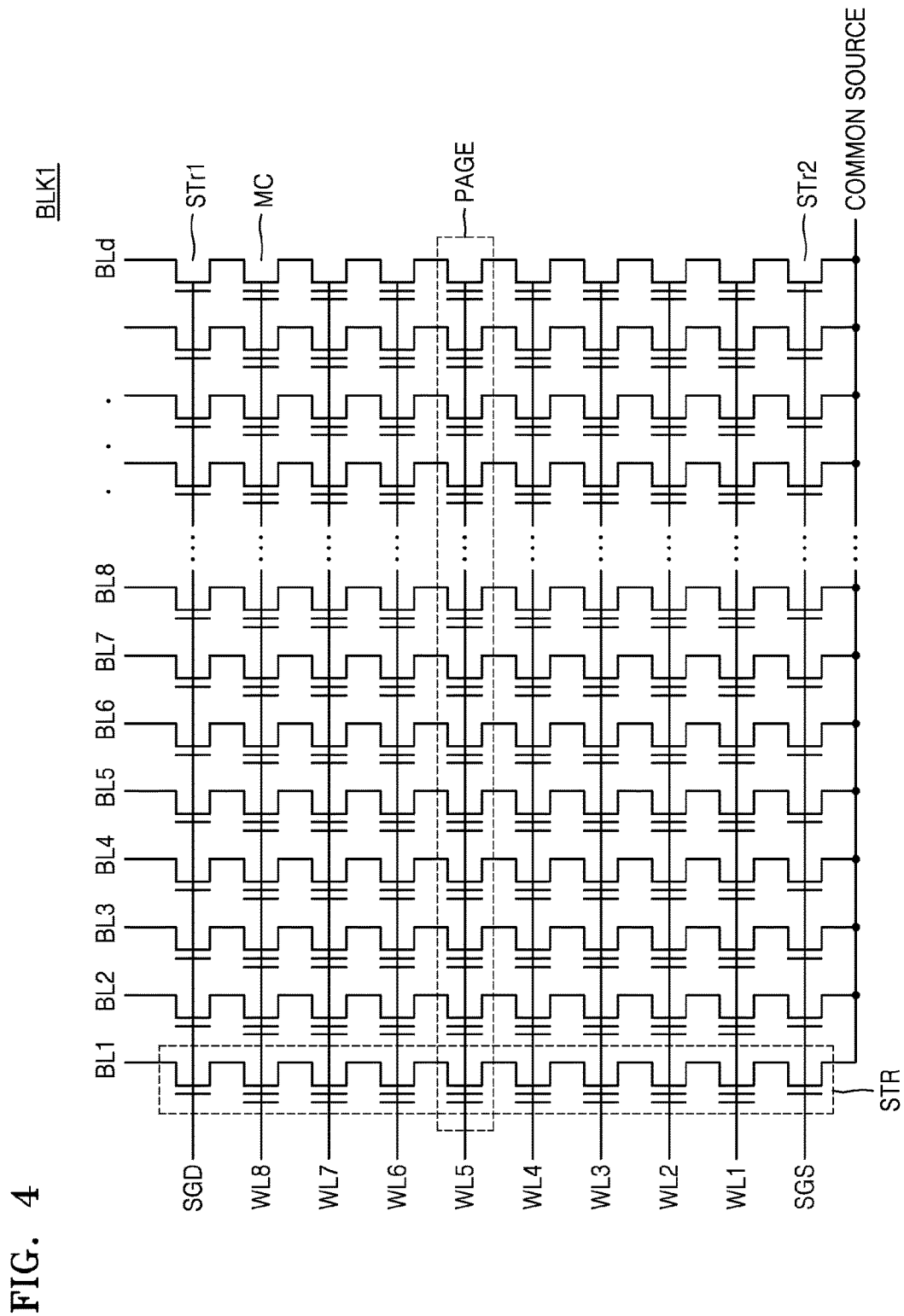
FIG. 4 is a circuit diagram illustrating a first memory block that is included in the memory cell array of FIG. 3, according to an exemplary embodiment.

FIG. 4 is a circuit diagram illustrating the first memory block BLK1 that is included in the memory cell array 110 of FIG. 3, according to an exemplary embodiment.

Referring to FIG. 4, the first memory block BLK1 may be a horizontal NAND flash memory block, and each of the first through ath memory blocks BLK1 through BLKa of FIG. 3 may be formed as shown in FIG. 4. The first memory block BLK1 may include, for example, d (d is an integer equal to or greater than 2) strings STR in which 8 memory cells are serially connected. Each of the strings STR may include a drain selection transistor STr1 and a source selection transistor STr2 that are respectively connected to both ends of the memory cells MC that are serially connected. The number of the strings STR, the number of the word lines WL, and the number of the bit lines BL may be changed in various ways according to exemplary embodiments.

The NAND flash memory device of FIG. 4 may allow an erase operation to be performed in units of memory blocks and may allow a program operation to be performed in units of pages corresponding to word lines WL1 through WL8. For example, when the memory cell MC is a single-level cell, one page may correspond to each word line. Alternatively, when the memory cell MC is a multi-level cell or a triple-level cell, a plurality of pages may correspond to each word line.

Figure 5:
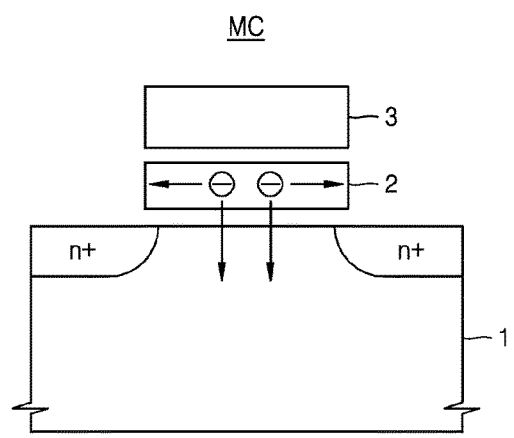
FIG. 5 is a cross-sectional view illustrating a memory cell that is included in the first memory block of FIG. 4, according to an exemplary embodiment.

FIG. 5 is a cross-sectional view illustrating the memory cell MC that is included in the first memory block BLK1 of FIG. 4, according to an exemplary embodiment.

Referring to FIG. 5, the memory cell MC may include a channel region 1, a charge storage layer 2, and a control gate 3. For example, the charge storage layer 2 may include a floating gate that is a conductor, and in this case, the memory cell MC may be referred to as a floating gate structure cell. Alternatively, the charge storage layer 2 may include, for example, silicon nitride (SiN) that is a non-conductor, and in this case, the memory cell MC may be referred to as a charge trap flash (CTF) cell.

In order to perform a program operation on the memory cell MC, a relatively high program voltage may be applied to the control gate 3 and a relatively low voltage (for example, 0 V) may be applied to the channel region 1. Since an electric field is formed in a direction from the control gate 3 to the channel region 1 according to such a bias condition, charges, for example, electrons, may move from the channel region 1 to the charge storage layer 2, and thus the memory cell MC may be programmed.

When the memory device 100 is a flash memory device, data that is stored in the memory cell MC may be read according to the threshold voltage Vth of the memory cell MC. In this case, the threshold voltage Vth of the memory cell MC may be determined by the number of electrons that are stored in the charge storage layer 2. In detail, as the number of electrons that are stored in the charge storage layer 2 increases, the threshold voltage Vth of the memory cell MC may increase.

As a time after a program operation performed on the memory cell MC is completed increases, that is, as a retention time increases, charge loss increases. In detail, as time passes, electrons that are trapped in the charge storage layer 2 during a program operation are rearranged, for example, move to the channel region 1 (as represented by a vertical arrow of FIG. 5) to be lost or move in the charge storage layer 2 (as represented by a horizontal arrow of FIG. 5) to be reduced. Accordingly, the threshold voltage Vth of the memory cell MC may be reduced, and thus there may be drooping and spreading in a distribution of the threshold voltage Vth of the memory cells MC.

Figure 6:
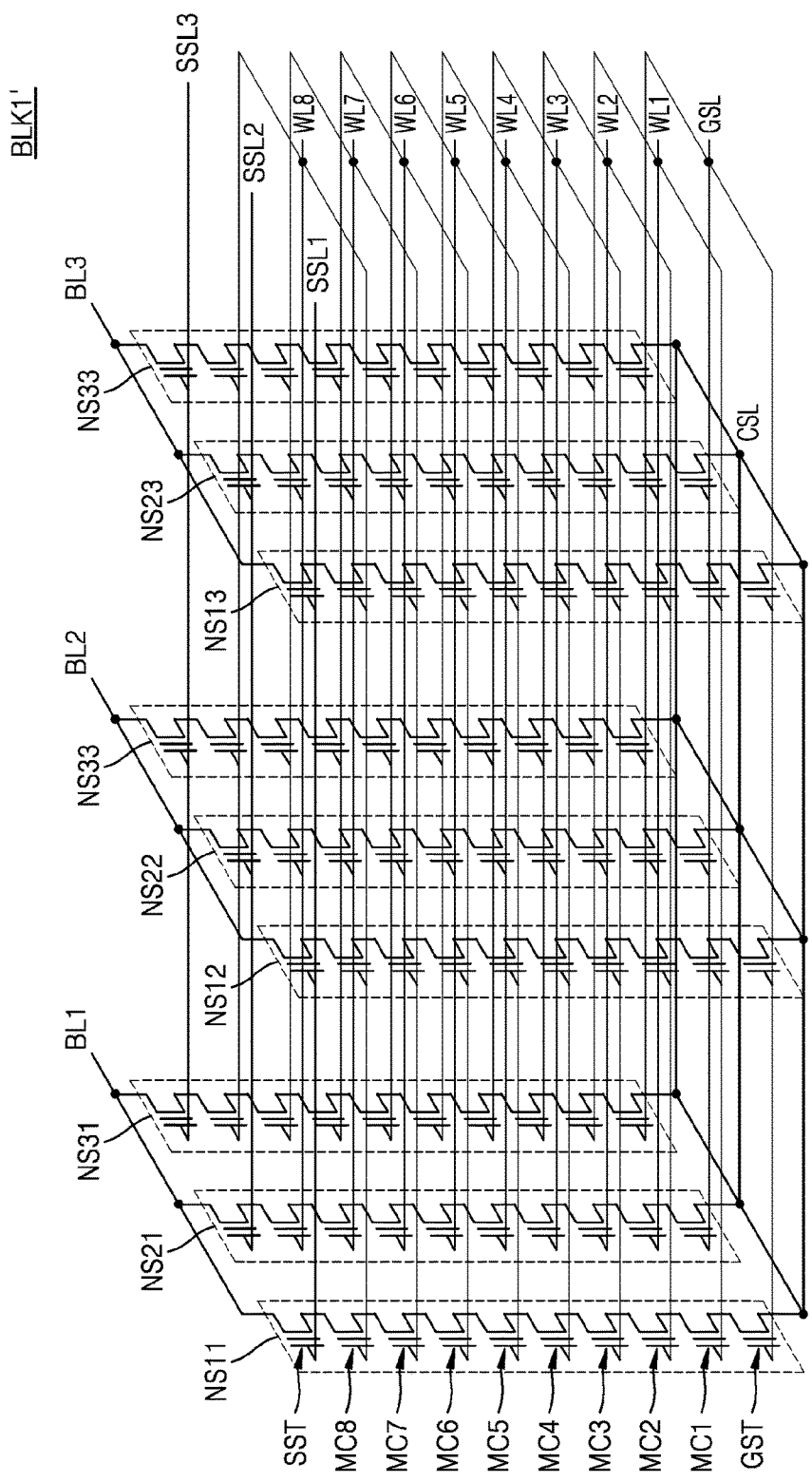
FIG. 6 is a circuit diagram illustrating a first memory block that is included in the memory cell array of FIG. 3, according to another exemplary embodiment.

FIG. 6 is a circuit diagram illustrating a first memory block BLK1' that is included in the memory cell array 110 of FIG. 3, according to another exemplary embodiment.

Referring to FIG. 6, the first memory block BLK1' may be a vertical NAND flash memory block, and the first through ath memory blocks BLK1 through BLKa of FIG. 3 may be formed as shown in FIG. 6. The first memory block BLK1' may include a plurality of NAND strings NS11 through NS33, the plurality of word lines WL1 through WL8, a plurality of bit lines BL1 through BL3, the ground selection line GSL, a plurality of string selection lines SSL1 through SSL3, and a common source line CSL. The number of the NAND strings, the number of the word lines, the number of the bit lines, the number of the ground selection lines, and the number of the string selection lines may be changed in various ways according to exemplary embodiments.

The NAND strings NS11 through NS33 are connected between the bit lines BL1 through BL3 and the common source line CSL. Each of the NAND strings NS11 through NS33 (for example, NS11) may include a string selection transistor SST, the plurality of memory cells MC1 through MC8, and a ground selection transistor GST that are serially connected.

The string selection transistor SST is connected to the string selection lines SSL1 through SSL3. The plurality of memory cells MC1 through MC8 are respectively connected to the word lines WL1 through WL8. The ground selection transistor GST is connected to the ground selection line GSL. The string selection transistor SST is connected to the bit line BL corresponding to the string selection transistor SST, and the ground selection transistor GST is connected to the common source line CSL.

Word lines having the same height (for example, the word lines WL1) are commonly connected, and the string selection liens SSL1 through SSL3 are separated from one another. When memory cells that are connected to the first word lines WL1 and belong to the NAND strings NS11, NS12, and NS13 are programmed, the first word line WL1 and the first string selection line SSL1 are selected.

Figure 7:
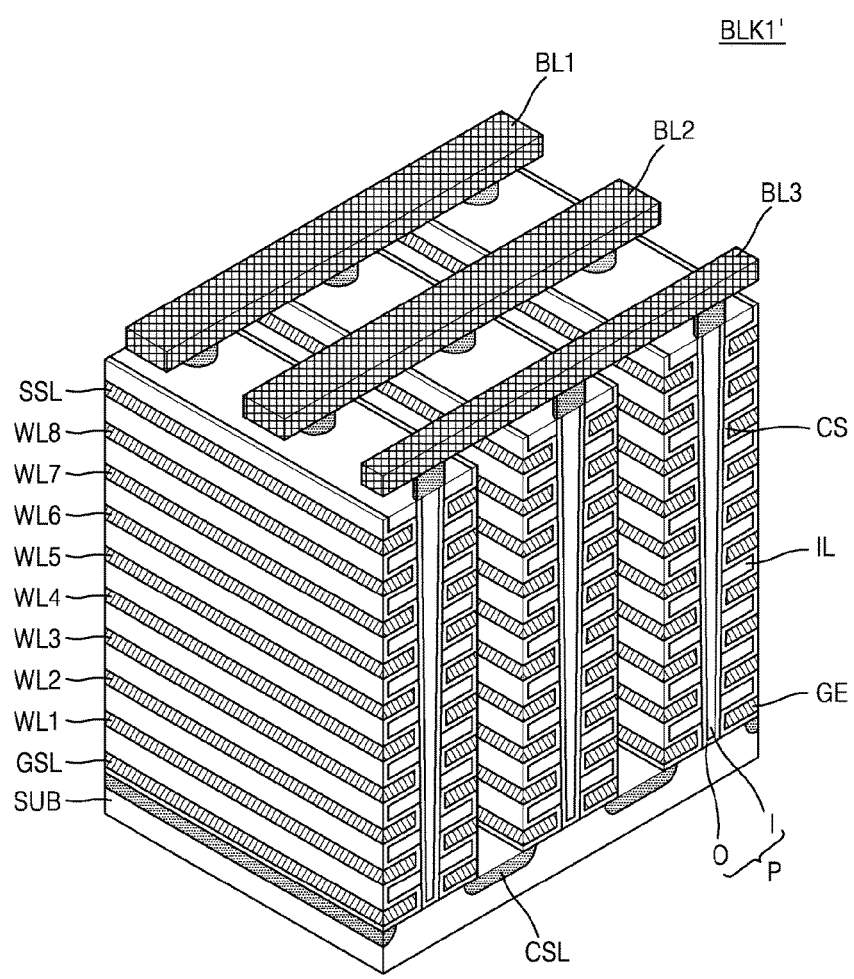
FIG. 7 is a perspective view illustrating the first memory block of FIG. 6, according to an exemplary embodiment.

FIG. 7 is a perspective view illustrating the first memory block BLK1' of FIG. 6, according to an exemplary embodiment.

Referring to FIG. 7, the first memory block BLK1' is formed in a direction that is perpendicular to a substrate SUB. The common source line CSL is disposed in the substrate SUB, and gate electrodes GE and insulating layers IL are alternately stacked on the substrate SUB. Also, a charge storage layer CS may be formed between the gate electrodes GE and the insulating layers IL.

When the plurality of gate electrodes GE and the plurality of insulating layers IL that are alternately stacked are vertically patterned, a pillar P having a V-shape is formed. The pillar P passes through the gate electrodes GE and the insulating layers IL and is connected to the substrate SUB. An outer portion 0 of the pillar P may be formed of a semiconductor material and may function as a channel region, and an inner portion I of the pillar P may be formed of an insulating material such as silicon oxide.

The gate electrodes GE of the first memory block BLK1' may be connected to the ground selection line GSL, the plurality of word lines WL1 through WL8, and the string selection line SSL. The pillar P of the first memory block BLK1' may be connected to the plurality of bit lines BL1 through BL3. Although the first memory block BLK1' includes two selection lines GSL and SSL, eight word lines WL1 through WL8, and three bit lines BL1 through BL3 in FIG. 7, the number of the elements is not limited thereto and various modifications may be made.

Figure 8A:
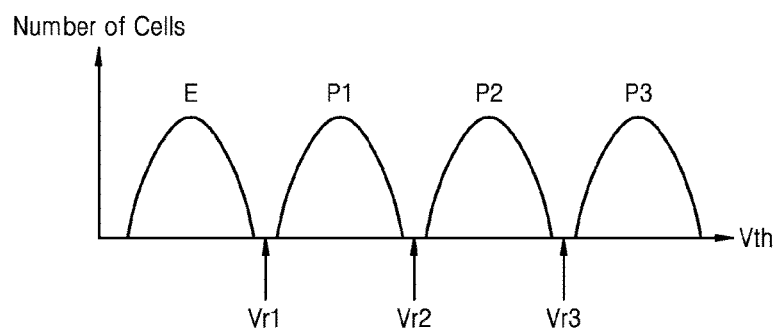
FIG. 8A is a graph illustrating threshold voltage distributions of programmed multi-level memory cells of a memory device, according to an exemplary embodiment.

FIG. 8A is a graph illustrating threshold voltage distributions with after a program operation performed on the memory device 100 is completed in the case where the memory cell MC is a multi-level cell, according to an exemplary embodiment.

Referring to FIG. 8A, the horizontal axis represents the threshold voltage Vth and the vertical axis represents the number of the memory cells MC. The memory cells MC may be the memory cells MC of FIG. 4 or 6. When each of the memory cells MC is a multi-level cell that is programmed to 2 bits, the memory cell MC may have one from among the erase state E, a first program state P1, a second program state P2, and a third program state P3. Since an interval (spacing) between threshold voltage distributions in a multi-level cell is less than that in a single-level cell, a multi-level cell is more susceptible to problems caused by a slight change in the threshold voltage Vth in the multi-level cell.

Each of first through third read voltages Vr1, Vr2, and Vr3 corresponds to a default level that is initially set. In detail, the first read voltage Vr1 has a voltage level between a distribution of the memory cell MC having the erase state E and a distribution of the memory cell MC having the first program state P1. The second read voltage Vr2 has a voltage level between the distribution of the memory cell MC having the first program state P1 and a distribution of the memory cell MC having the second program state P2. The third read voltage Vr3 has a voltage level between the distribution of the memory cell MC having the second program state P2 and a distribution of the memory cell MC having the third program state P3.

For example, when the first read voltage Vr1 is applied to a control gate of the memory cell MC, the memory cell MC having the erase state E is turned on and the memory cell MC having the first program state P1 is turned off. Once the memory cell MC is turned on, current flows through the memory cell MC, and once the memory cell MC is turned off, current does not flow through the memory cell MC. Accordingly, data that is stored in the memory cell MC may be distinguished according to whether the memory cell MC is turned on or off.

In an exemplary embodiment, when the first read voltage Vr1 is applied and the memory cell MC is turned on, data '1' may be stored. When the memory cell MC is turned off, data '0' may be stored. However, the inventive concept is not limited thereto, and in another exemplary embodiment, when the first read voltage Vr1 is applied and the memory cell MC is turned on, data '0' may be stored and when the memory cell MC is turned off, data '1' may be stored. As such, allocation of a logic level of data may vary according to exemplary embodiments.

Figure 8B:
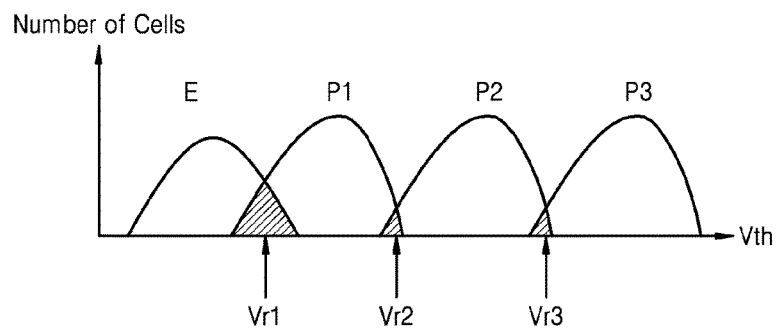
FIG. 8B is a graph illustrating threshold voltage distributions of the memory cells of FIG. 8A after the lapse of a given time period after programming, according to an exemplary embodiment.

FIG. 8B is a graph illustrating threshold voltage distributions Vth of the memory cells described in connection with FIG. 8A after the lapse of a given time period from completion of the program operation, according to an exemplary embodiment.

Referring to FIG. 8B, as a retention time increases, the threshold voltage Vth of the memory cells MC that are programmed to have the erase state E and the first through third program states P1 through P3 may decrease, and thus modified distributions of FIG. 8B may be obtained. A read error may occur in memory cells MC that fall within the hatched areas shown in FIG. 8B, thereby reducing the reliability of the memory device 100.

For example, when a read operation is performed on the memory device 100 by using the first read voltage Vr1, memory cells MC of the far-left hatched area that were originally programmed in the P1 state may be read as having the erase state E due to a reduction in threshold voltage Vth. Accordingly, an error occurs in the read operation, thereby reducing the reliability of the memory device 100.

When data is read from the memory device 100, a raw bit error rate (RBER) may vary according to a voltage level of a read voltage, and an optimum voltage level of the read voltage may be determined according to a distribution shape of the memory cell MC. Accordingly, as a distribution of the memory cell MC changes, the optimum voltage level of the read voltage that is necessary to read the data from the memory device 100 may change. Hence, it is necessary to determine the optimum voltage level of the read voltage by changing the voltage level of the read voltage based on a change in the distribution. In this case, in order to efficiently determine the optimum voltage level of the read voltage, it is necessary to reduce power consumption and an operation time by simplifying a mathematical operation.

A case where the memory cell MC is a multi-level cell has been explained with reference to FIGS. 8A and 8B. However, the inventive concept is not limited thereto, and the memory cell MC may be a single-level cell, a triple-level cell, or a cell that is programmed to 4 bits or more. Also, the memory device 100 of FIGS. 1 and 2 may include the memory cells MC that are programmed to different number of bits.

Figure 9:
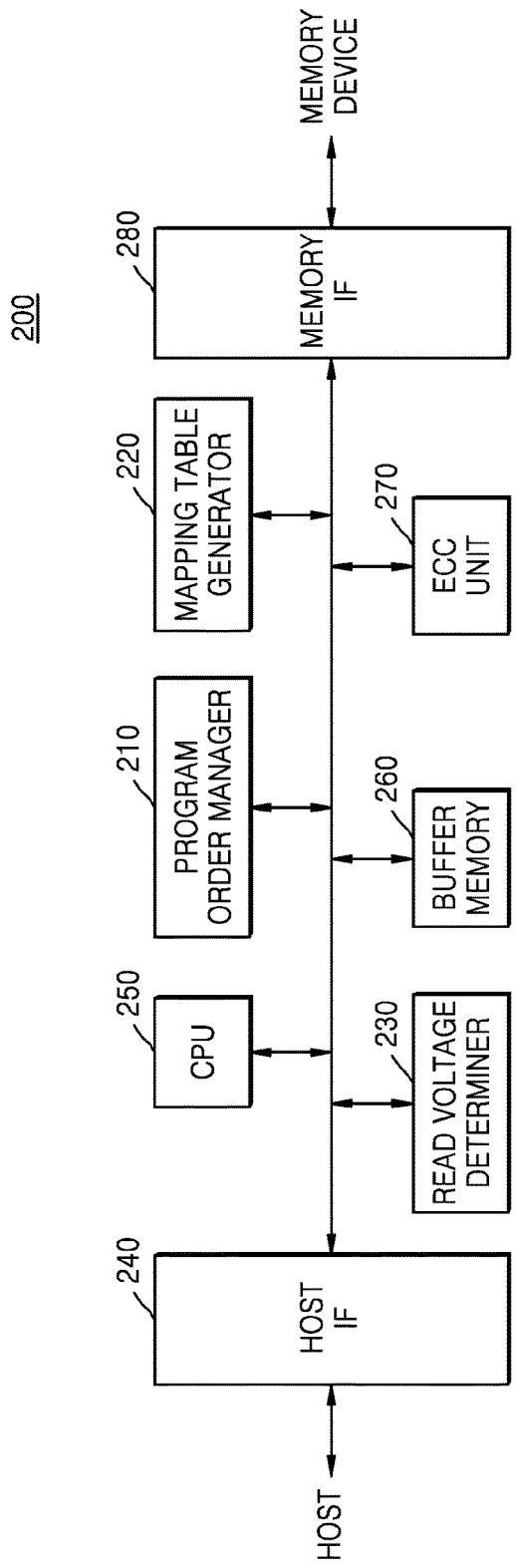
FIG. 9 is a detailed block diagram illustrating a memory controller that is included in the memory system of FIG. 1, according to an exemplary embodiment.

FIG. 9 is a detailed block diagram illustrating the memory controller 200 that is included in the memory system 10 of FIG. 1, according to an exemplary embodiment.

Referring to FIG. 9, the memory controller 200 may include the program order manager 210, the mapping table generator 220, the read voltage determiner 230, a host interface 240, a central processing unit (CPU) 250, a buffer memory 260, an error correction code (ECC) unit 270, and a memory interface 280.

The host interface 240 may receive a request of a memory operation from a host by interfacing with the host. In detail, the host interface 240 may receive various requests such as a data read request and a data write request from the host, and generates various internal signals for the memory operation of the memory device 100 in response to the various requests. For example, the memory controller 200 may be configured to communicate with the host through at least one selected from various interface protocols such as a universal serial bus (USB), multimedia card (MMC), peripheral component interconnect-express (PCI-E), advanced technology attachment (ATA), serial-ATA, parallel-ATA, small computer system interface (SCSI), enhanced small disk interface (ESDI), and integrated drive electronics (IDE).

The CPU 250 may control an overall operation of the memory controller 200. For example, the CPU 250 may control various functional blocks related to the memory operation of the memory device 100. Although the program order manager 210, the mapping table generator 220, and the read voltage determiner 230 are shown as separate blocks in the present exemplary embodiment, the program order manager 210, the mapping table generator 220, and the read voltage determiner 230 may operate as a part of the CPU 250. A detailed operation of the program order manager 210 will be explained below with reference to FIGS. 10A through 15. Also, detailed operations of the mapping table generator 220 and the read voltage generator 230 will be explained below with reference to FIGS. 16 through 23.

The buffer memory 260 may temporarily store data that is transmitted to the outside through the host interface 240 and data that is transmitted from the memory device 100 through the memory interface 280. Also, the buffer memory 260 may temporarily store information that is necessary to control the memory device 100. In the present exemplary embodiment, the buffer memory 260 may temporarily store program order information that is generated by the program order manager 210. Also, in the present exemplary embodiment, the buffer memory 260 may temporarily store a mapping table that is generated by the mapping table generator 220. For example, although the buffer memory 260 may be a dynamic RAM (DRAM), a static RAM (SRAM), or a combination of the DRAM and the SRAM, the inventive concept is not limited thereto.

The ECC unit 270 may perform ECC encoding on write data and ECC decoding on read data by using an algorithm such as a Reed-Solomon (RS) code, a Hamming code, or a cyclic redundancy code (CRC), may generate an error detection result from data that is read from the memory device 100, and may perform error correction on the read data. For example, the ECC unit 270 may detect an error bit by comparing a parity bit that is generated and stored when data is programmed with a parity bit that is generated when data is read, and may correct the error bit by performing a predetermined logic operation (for example, exclusive OR (XOR)) on the detected error bit.

The memory interface 280 may interface with the memory device 100 to transmit and receive various signals (for example, a command, an address, and a read voltage control signal) that are generated in the memory controller 200.

FIGS. 10A through 10E are diagrams for reference in explaining operations of managing program order information, according to exemplary embodiments.

Figure 10A:
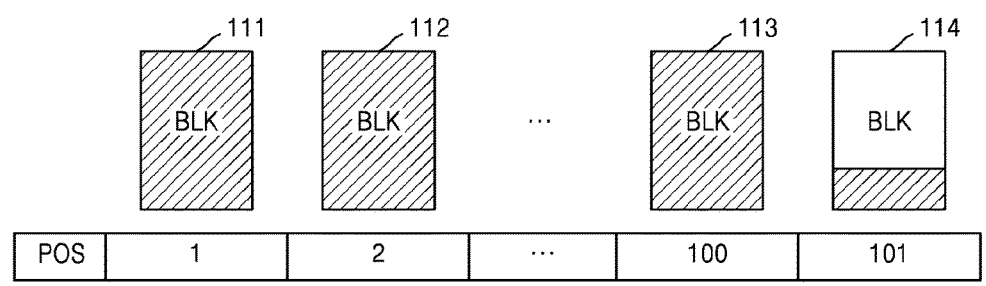
FIGS. 10A, 10B, 10C, 10D and 10E are diagrams for reference in explaining operations of managing program order information, according to exemplary embodiments.
Figure 10B:
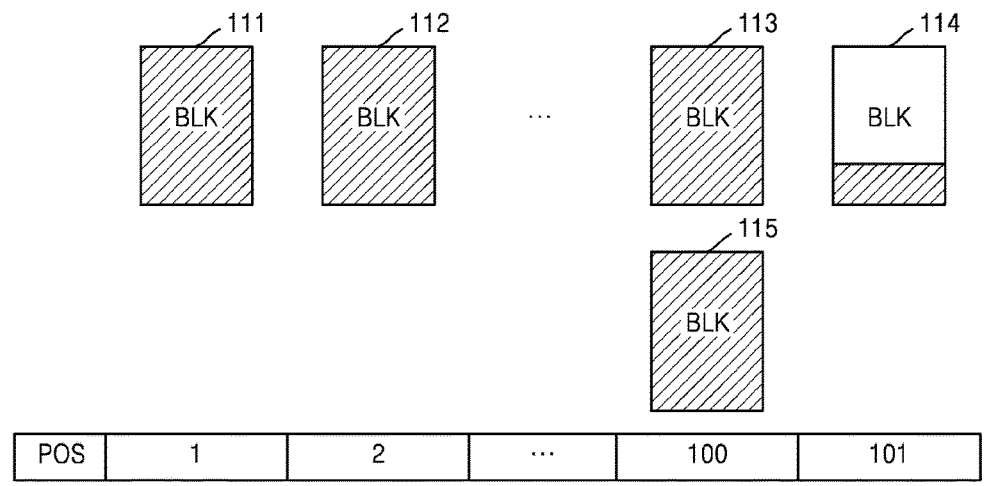
Figure 10C:
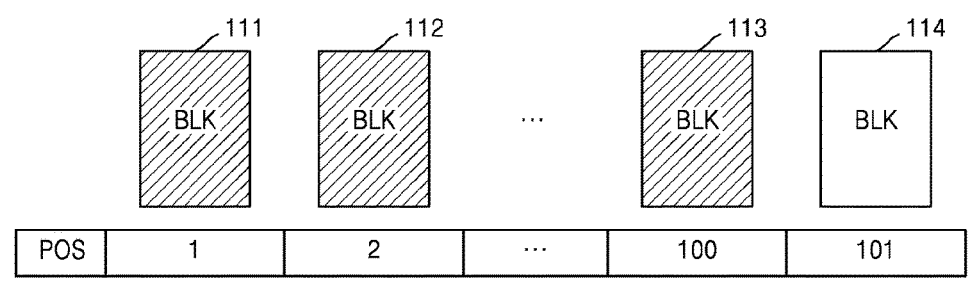
Figure 10D:
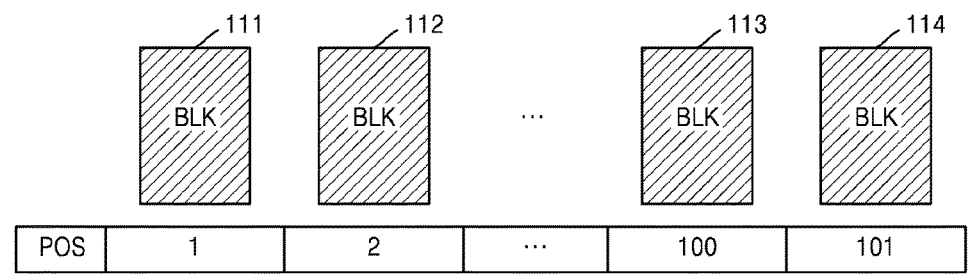
Figure 10E:
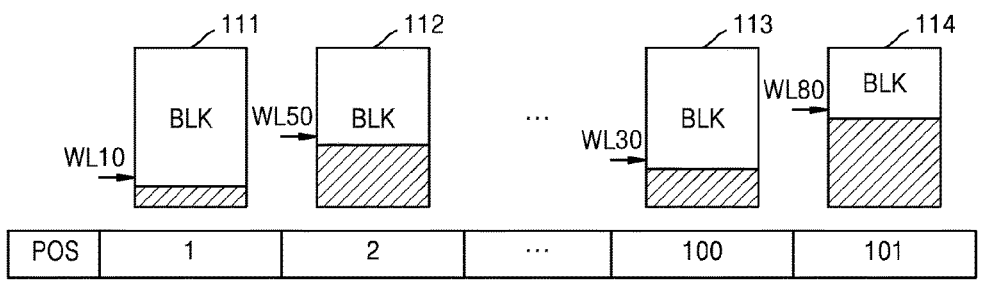

The operations of managing the program order information of FIGS. 10A through 10E may be performed by the program order manager 210 of FIG. 9. FIGS. 10A through 10D illustrate an operation of the program order manager 210 when a plurality of memory groups are divided according to memory blocks, and FIG. 10E illustrates an operation of the program order manager 210 when the plurality of memory groups are divided according to word lines.

Referring to FIG. 10A, the program order manager 210 may allocate a POS to a memory block when a program operation or an erase operation is performed on the memory block. When a program operation is firstly performed on a first memory block 111 from among a plurality of memory blocks that are included in the memory device 100, a value of a POS corresponding to the first memory block 111 may be '1'. Next, the program operation is secondly performed on a second memory block 112, a value of a POS of the second memory block 112 is '2'. Next, when the program operation is 100thly performed on a third memory block 113, a value of a POS corresponding to the third memory block 113 is '100'. Next, when the program operation is 101thly performed on a fourth memory block 114, a value of a POS corresponding to the fourth memory block 114 is '101'.

Referring to FIG. 10B, the program order manager 210 may allocate the same POS to a plurality of memory blocks when program operations are simultaneously or sequentially performed on the plurality of memory blocks. Also, the program order manager 210 may allocate the same POS to a plurality of memory blocks when erase operations are simultaneously or sequentially performed on the plurality of memory blocks (that is, when the plurality of memory blocks are allocated as active memory blocks).

In an exemplary embodiment, when program operations are simultaneously performed on the third memory block 113 and a fifth memory block 115, values of POSs corresponding to the third memory block 113 and the fifth memory block 115 are '100'. In another exemplary embodiment, when a time between a program operation of the third memory block 113 and a program operation of the fifth memory block 115 is less than a critical time (for example, 10 seconds), values of the POSs corresponding to the third memory block 113 and the fifth memory block 115 are '100'. As such, according to the present exemplary embodiment, the plurality of memory groups may share one POS.

Referring to FIG. 10C, the program order manager 210 may allocate a POS to a memory block when a program operation of the memory block starts or an erase operation of the memory block is performed. In an exemplary embodiment, when a program operation of the fourth memory block 114 starts, a value of a POS corresponding to the fourth memory block 114 is '101'. In another exemplary embodiment, when an erase operation of the fourth memory block 114 starts, a value of the POS corresponding to the fourth memory block 114 is '101'.

Referring to FIG. 10D, the program order manager 210 may allocate a POS to a memory block when a program operation of the memory block is completed. In the present exemplary embodiment, when a program operation of the fourth memory block 114 is completed, a value of a POS corresponding to the fourth memory block 114 is '101'.

Referring to FIG. 10E, the program order manager 210 may divide a plurality of memory blocks according to word lines and may generate program order information according to the word lines. For example, when the memory device 100 is a vertical NAND flash memory device, a program operation is performed on a plurality of word lines that are included in one memory block in an order from a word line that is disposed adjacent to the ground selection line GSL to a word line that is disposed adjacent to the string selection line SSL. Accordingly, when a POS is allocated to one word line that is included in one memory block, a program order of another word line that is adjacent to the one word line may be predicted.

In the present exemplary embodiment, the program order manager 210 may allocate a POS to a word line when a program operation or an erase operation is performed on the word line. In an exemplary embodiment, when a program operation is repeatedly performed on a word line, the program order manager 210 may allocate a POS to the word line when the program operation is firstly performed. In another exemplary embodiment, when a program operation is repeatedly performed on a word line, the program order manager 210 may allocate a POS to the word line when the program operation is lastly performed. In another exemplary embodiment, the program order manager 210 may allocate a POS to a word line when a reprogram operation is performed on the word line and a fine program operation is completed.

When a program operation is firstly performed on a word line WL10 that is included in the first memory block 111, a value of a POS corresponding to the word line WL10 is '1'. Next, when the program operation is secondly performed on a word line WL50 that is included in the second memory block 112, a value of a POS corresponding to the word line WL50 is '2'. Next, when the program operation is 100thly performed on a word line WL30 that is included in the third memory block 113, a value of a POS corresponding to the word line WL30 is '100'. Next, when the program operation is 101thly performed on a word line WL80 that is included in the fourth memory block 114, a value of a POS corresponding to the word line WL80 is '101'.

In the present exemplary embodiment, since a plurality of memory groups are divided according to word lines and program order information is generated according to the word lines, even when a program time difference between different word lines that are included in the same block is large, the reliability of the memory device 100 may be ensured. For example, when a program operation is not performed for a long time on the memory device 100 and then the program operation is resumed, a program time difference between different word lines that are included in the same block may be large. Alternatively, when power is not supplied for a long time to the memory device 100 and power supply is resumed, a program time difference between different word lines that are included in the same block may be large.

Figure 11:
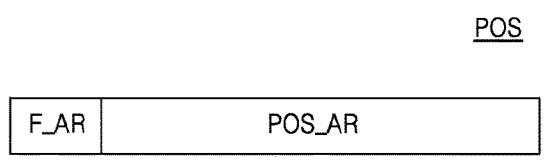
FIG. 11 is a diagram illustrating a memory area that stores a program order stamp (POS), according to an exemplary embodiment.

FIG. 11 is a diagram illustrating a memory area that stores a POS, according to an exemplary embodiment.

Referring to FIG. 11, the program order manager 210 may allocate a POS to each memory group and may store the POS in an area of the memory group. In an exemplary embodiment, when a plurality of memory groups are divided according to memory blocks, in order to store POSs, for example, a 4-byte memory area may be allocated to each memory block. In the present exemplary embodiment, the memory area may include a flag area F-AR and a POS area POS_AR. For example, the flag area F_AR may be allocated to have 1 bit and the POS area POS_AR may be allocated to have 31 bits.

The flag area F_AR is an area for storing a flag indicating whether the memory block is to be used in order to update a mapping table that stores a read voltage offset and a POS corresponding to the read voltage offset. The read voltage offset may be an offset in a read voltage that is initially set, that is, an offset from a default level, in order to perform a read operation on the memory device 100.

In an exemplary embodiment, the program order manager 210 may reset the flag to '0' when a new POS is allocated. Accordingly, when the flag is '0', the program order manager 210 may use the memory block in order to update the mapping table, and when the flag is '1', the program order manager 210 may not use the memory block in order to update the mapping table.

In another exemplary embodiment, when a specific memory group has greater charge loss than other memory groups corresponding to adjacent POSs due to read disturbance, the program order manager 210 may set the flag to '1'. The specific memory group may be referred to as an outlier group. As such, since the flag of the outlier group is set to '1', a read result of the outliner group may not be used in order to update the mapping table. A typical read retry operation may be performed on the outlier group.

The POS area POS_AR is an area for storing the POS that is allocated to the memory block. For example, when the POS area POS_AR is allocated to have 31 bits and a size of the memory block is 1 TB, the POS of the memory block may be stably stored until a program/erase cycle is repeated 12,000 times.

FIG. 12 illustrates a table that stores program order information, according to an exemplary embodiment.

Referring to FIG. 12, the program order manager 210 may sequentially store in a program order table TABLE1 POSs according to addresses of a plurality of memory groups in order to search for the POSs according to the addresses of the plurality of memory groups. For example, when the memory groups are divided according to memory blocks, the program order table TABLE1 may store POSs according to addresses of the memory blocks. Alternatively, when the memory groups are divided according to word lines, the program order table TABLE1 may store POSs according to addresses of the word lines.

Reference numeral '121' denotes the program order table TABLE1 when a program operation is firstly performed in the memory device 100. When an address of a memory group on which the program operation is firstly performed is '2', a value of a POS corresponding to the memory group is '1'. In this case, since the program operation is not performed on remaining memory groups, that is, (N−1) memory groups, values of POSs corresponding to the remaining memory groups are all '0'.

Reference numeral '122' denotes the program order table TABLE1 when a program operation is 30000thly performed in the memory device 100. When an address of a memory group on which the program operation is 30000thly performed is 'K', a value of a POS corresponding to the memory group is '30000'.

As described above with reference to FIGS. 10A through 10E, the program order manager 210 may allocate a POS to a first memory block when a program operation of the first memory block from among a plurality of memory blocks that are included in the memory device 100 starts, when the program operation of the first memory block is completed, or when an erase operation of the first memory block is performed. Also, the program order manager 210 may allocate a POS to a first word line when a program operation is firstly performed on the first word line from among a plurality of word lines that are included in the memory device 100 or when the program operation is lastly performed.

FIG. 13 illustrates a table that stores program order information, according to another exemplary embodiment.

Referring to FIG. 13, the program order manager 210 may store in a program order table TABLE2 addresses of memory groups corresponding to POSs according to POSs that are sequentially increased, in order to search for the addresses of the plurality of memory groups according to the POSs that are sequentially increased. For example, when the memory groups are divided according to memory blocks, the program order table TABLE2 may store addresses of the memory blocks corresponding to POSs. Alternatively, when the memory groups are divided according to word lines, the program order table TABLE2 may store addresses of the word lines corresponding to POSs.

An address of a memory group when a program operation is firstly performed in the memory device 100 may be '2843', an address of a memory group when the program operation is secondly performed may be '173', and an address of a memory group when the program operation is Mthly performed may be '27'. As such, since the program order table TABLE2 stores the addresses of the memory groups corresponding to the POSs that are sequentially increased, a time taken to search for program order information in order to control operations of the memory groups according to a program order may be reduced.

Figures 14A, 14B:
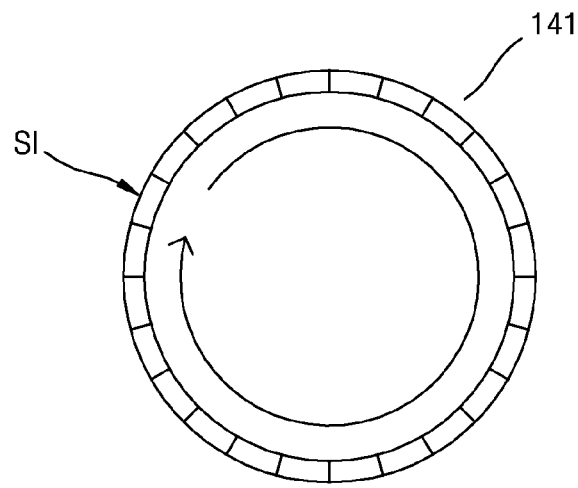
FIGS. 14A and 14B are respectively a view and a diagram illustrating a circular buffer that stores program order information, according to another exemplary embodiment.

FIGS. 14A and 14B are respectively a view and a diagram illustrating a circular buffer (or a ring buffer) 141 that stores program order information, according to another exemplary embodiment.

Referring to FIG. 14A, the program order manager 210 may store program order information by using the circular buffer 141. However, the inventive concept is not limited thereto, and in another exemplary embodiment, the program order manager 210 may store program order information by using an arbitrary first-in first-out (FIFO) buffer.

The circular buffer 141 is a data structure that uses a buffer having a fixed size as if both ends of the buffer are connected to each other. Data may be input to a continuous space that is included in the circular buffer 141 and data may be output in an order in which the data is input. A position of data that is firstly input to the circular buffer 141 may be indicated with a start index SI.

Referring to FIG. 14B, addresses may be stored in the continuous space that is included in the circular buffer 141. In this case, the same address may be stored to correspond to different indices. For example, an address '10' may be stored to correspond to an index '0' and an index '5'. In the present exemplary embodiment, a latest index may be determined by using the start index SI that indicates, for example, '3'.

Figure 15:
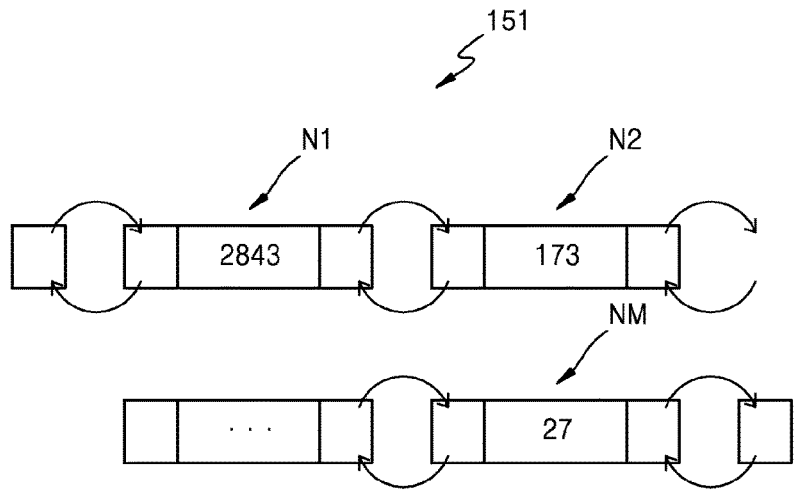
FIG. 15 is a diagram illustrating a doubly-linked list that stores program order information, according to another exemplary embodiment.

FIG. 15 is a diagram illustrating a doubly-linked list 151 that stores program order information, according to another exemplary embodiment.

Referring to FIG. 15, the program order manager 210 may store program order information by using the doubly-linked list 151. However, the inventive concept is not limited thereto, and in another exemplary embodiment, the program order manager 210 may store program order information by using a singly-linked list.

The doubly-linked list 151 is configured to include two pointers indicating a previous node and a next node and data of each node, and thus each node is accessible in either direction. An address corresponding to a POS having a value of '1' and an address corresponding to a latest POS having a value of 'M' may be easily searched for by using the doubly-linked list 151.

In the present exemplary embodiment, the program order manager 210 may store an address of a memory group in a data area of each node of the doubly-linked list 151. For example, a first node N1 may store an address '2843' corresponding to a POS having a value of '1', a second node N2 may store an address '173' corresponding to a POS having a value of '2', and an Mth node NM may store an address '27' corresponding to a POS having a value of 'M'.

As described above with reference to FIGS. 12 through 15, the program order manager 210 may store program order information by using at least one selected from a table, a linked list, a doubly-linked list, a circular buffer, and a FIFO buffer. However, the inventive concept is not limited thereto, and the program order manager 210 may store program order information by using other methods.

For example, when the memory device 100 includes at least two selected from a single-level cell block, a multi-level cell block, and a triple-level cell block, the program order manager 210 may manage program order information of only at least one selected from the multi-level cell block and the triple-level cell block. In detail, the program order manager 210 may not manage a program order of the single-level cell block and may manage a program order of only the multi-level cell block or the triple level-cell block, and may store program order information by using a table, a linked list, a doubly-linked list, a circular buffer, or a FIFO buffer.

Alternatively, when the memory device 100 includes a multi-level cell block and a triple level-cell block, the program order manager 210 may store first program order information of the multi-level cell block and may store second program order information of the triple-level cell block. In this case, the first and second program order information may be stored by using a table, a linked list, a doubly-linked list, a circular buffer, or a FIFO buffer.

Figure 16:
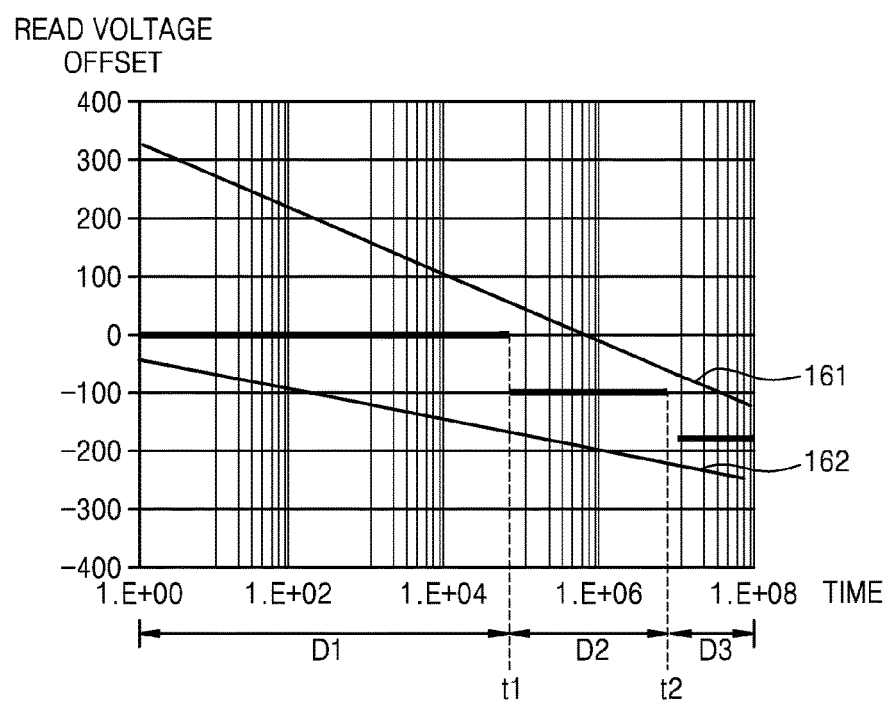
FIG. 16 is a graph illustrating a change in a read window relative to time, according to an exemplary embodiment.

FIG. 16 is a graph illustrating a change in a read window relative to time, according to an exemplary embodiment.

Referring to FIG. 16, the horizontal axis represents a time (laid out according to a log scale), specifically, a time after a program operation is completed. The vertical axis represents a read voltage offset (mV). The read window refers to a read voltage range in which a read operation of the memory device 100 may succeed. Hence, when a read operation is performed by using a voltage level that is in the read window, the read operation may succeed whereas when a read operation is performed by using a voltage level that is outside the read window, the read operation may fail.

Reference numeral '161' denotes an upper bound level of the read window relative to time, specifically, a highest level of the read voltage range relative to time. Reference numeral '162' denotes a lower bound level of the read window relative to time, specifically, a lowest level of the read voltage range relative to time. Accordingly, when a read operation is performed by using a read voltage offset between the upper bound level '161' and the lower bound level '162', the read operation may succeed whereas when a read operation is performed by using a read voltage offset that is greater than the upper bound level '161' or less than the lower bound level '162, the read operation may fail.

Assuming that a time after a program operation is completed is not relatively long, a read operation may succeed when the read operation is performed by using a default level at which the read voltage offset is 0. In FIG. 16, the default level may be used in order to perform a read operation in a first duration D1 that is a period from a time 0 to a first time t1.

Assuming that a time after a program operation is completed is relatively long, a read operation may fail when the read operation is performed by using the default level whereas and the read operation may succeed when the read operation is performed by using a predetermined read voltage offset. In FIG. 16, a first offset may be used in order to perform a read operation in a second duration D2 that is a period from the first time t1 to a second time t2, and the first offset may be, for example, −100 mV. Furthermore, in FIG. 16, a second offset may be used in order to perform a read operation in a third duration D3 that is a period equal to or greater than the second time t2, and the second offset may be, for example, −180 mV.

As described above, it is necessary to change a read voltage relative to time, that is, a retention time, after a program operation is completed. In a related art, a read operation is firstly performed by using a default level irrespective of a retention time. When a read failure occurs when the default level is used, a read retry operation is performed by sequentially increasing a magnitude of a read voltage offset.

Figure 17:
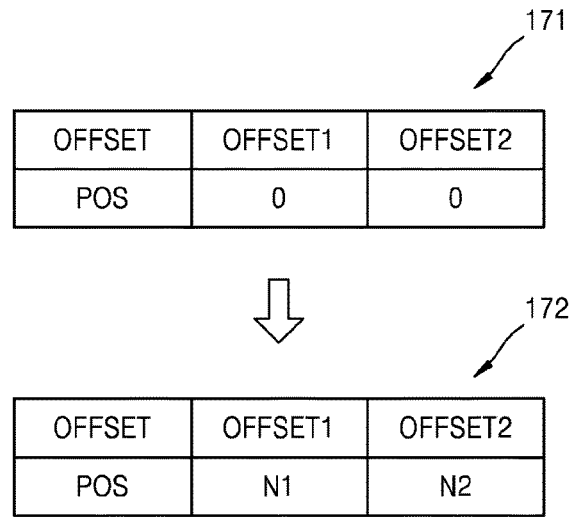
FIG. 17 is an initial mapping table and an updated mapping table, according to an exemplary embodiment.

FIG. 17 illustrates an initial mapping table 171 and an updated mapping table 172, according to an exemplary embodiment.

Referring to FIG. 17, in the initial mapping table 171 that is a mapping table before an operation of the mapping table generator 210 is performed, POSs corresponding to first and second offsets OFFSET1 and OFFSET2 are stored as 0. For example, the first offset OFFSET1 may be −40 mV and the second offset OFFSET2 may be −80 mV. However, the inventive concept is not limited thereto and a magnitude of each offset may be changed in various ways.

In an exemplary embodiment, the first and second offsets OFFSET1 and OFFSET2 may have fixed values irrespective of the memory device 100. In detail, the first and second offsets OFFSET1 and OFFSET2 may be hard-coded by firmware, and may have fixed values irrespective of a type, a capacity, and a retention condition of the memory device 100. In another exemplary embodiment, the first and second offsets OFFSET1 and OFFSET2 may have values that vary according to the memory device 100. In detail, the first and second offsets OFFSET1 and OFFSET2 may be stored in a NAND parameter block, and may have values that vary according to a type, a capacity, and a retention condition of the memory device.

In the updated mapping table 172 that is a mapping table after a generate operation or an update operation of the mapping table generator 210 is performed, POSs corresponding to the first and second offsets OFFSET1 and OFFSET2 may be respectively stored as N1 and N2. In an exemplary embodiment, block addresses respectively corresponding to the POSs N1 and N2 may be stored in the updated mapping table 172, and in another exemplary embodiment, word line indices respectively corresponding to the POSs N1 and N2 may be further stored in the updated mapping table 172. In this case, the mapping table generator 210 may generate the updated mapping table 172 so that the POS N1 is always equal to or greater than the POS N2.

Although only two offsets and POSs corresponding to the two offsets are shown in FIG. 17, the inventive concept is not limited thereto. In another exemplary embodiment, a mapping table may store one offset and a POS corresponding to the one offset. In another exemplary embodiment, a mapping table may store three or more offsets and POSs corresponding to the three or more offsets.

Figure 18:
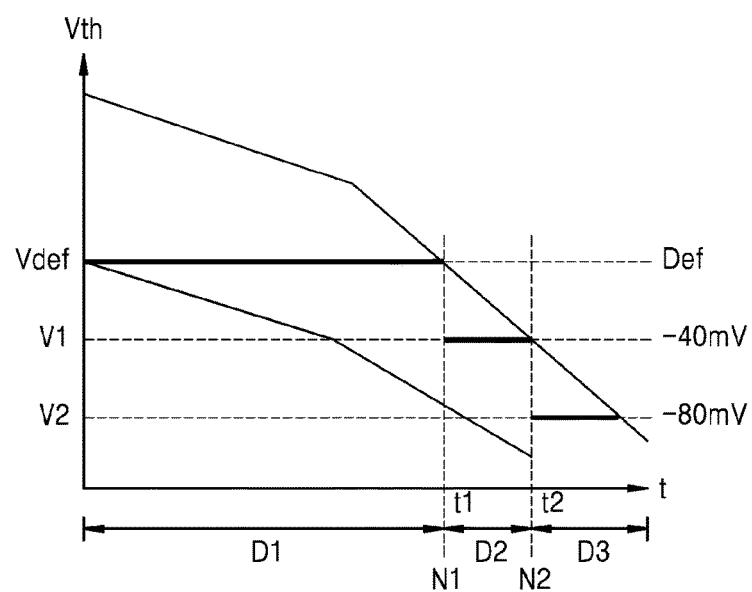
FIG. 18 is a graph illustrating a read level relative to time, according to an exemplary embodiment.

FIG. 18 is a graph illustrating a read level relative to time, according to an exemplary embodiment.

Referring to FIG. 18, the horizontal axis represents a time and the vertical axis represents the threshold voltage Vth. In detail, the horizontal axis represents a time, that is, a retention time, after a program operation is completed. A value of a POS may decrease as the retention time increases. FIG. 18 shows the POSs N1 and N2 that are generated by a mapping table generating operation of FIG. 17 and are stored in a mapping table.

Referring to FIGS. 9, 17, and 18, the read voltage determiner 230 may determine the default level Vdef as a read level in the first duration D1. The first duration D1 is a period from the time 0 to the first time t1, and the first time t1 may be determined based on the POS N1. Accordingly, in a memory group where a value of a POS is greater than that of the POS N1, a read operation may be performed by using the default level Vdef.

Also, the read voltage determiner 230 may determine a first level V1 to which a first offset, for example, −40 mV, to the default level Vdef is applied as a read level in the second duration D2. The second duration D2 is a period from the first time t1 to the second time t2, and the second time t2 may be determined based on the POS N2. Accordingly, in a memory group where a value of a POS is greater than that of the POS N2 and is less than that of the POS N1, a read operation may be performed by using the first level V1.

Also, the read voltage determiner 230 may determine a second level V2 to which a second offset, for example, −80 mV, to the default level Vdef is applied as a read level in the third duration D3. The third duration D3 is a period that is equal to or greater than the second time t2. Accordingly, in a memory group where a value of a POS is equal to or less than that of the POS N2, a read operation may be performed by using the second level V2.

Figure 19:
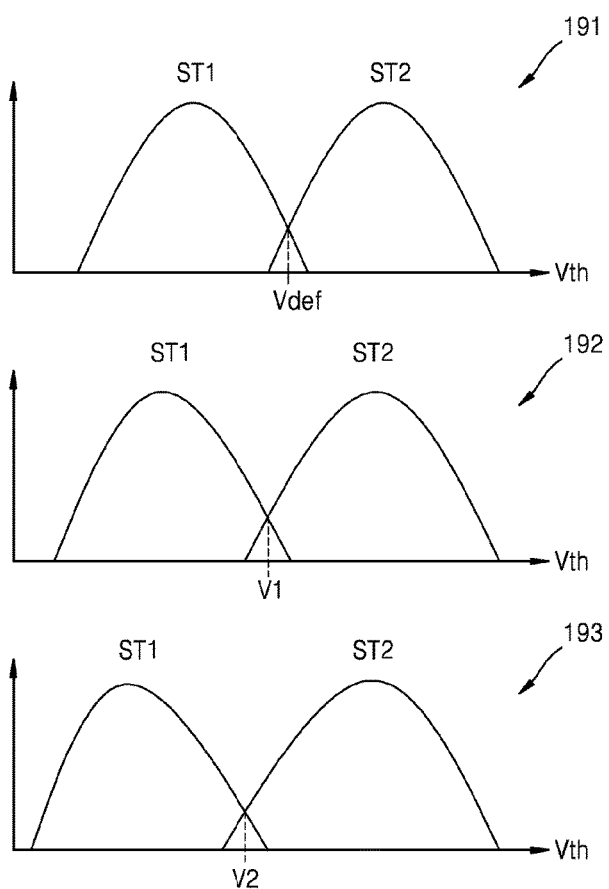
FIG. 19 is a graph illustrating some of threshold voltage distributions of the memory device, according to an exemplary embodiment.

FIG. 19 is a graph illustrating some of threshold voltage distributions Vth of the memory device 100, according to an exemplary embodiment.

Referring to FIG. 19, an initial distribution 191, a first variation distribution 192, and a second variation distribution 193 are distributions of memory cells that are programmed to have first and second states ST1 and ST2. The initial distribution 191 is a distribution right after a program operation of the memory cells is completed, the first variation distribution 192 is a distribution the first time t1 after the program operation of the memory cells is completed, and the second variation distribution 193 is a distribution the second time t2 after the program operation of the memory cells is completed. The first and second times t1 and t2 respectively correspond to the first and second times t1 and t2 of FIG. 18.

In the memory cells that are programmed to have the first and second states ST1 and ST2, the threshold voltage Vth decreases due to charge loss as a retention time increases. Accordingly, as time passes, the initial distribution 191 is changed to the first variation distribution 192, and as time passes, the first variation distribution 192 is changed to the second variation distribution 193. Accordingly, in order to improve the reliability of the memory device 100, it is necessary to change a read voltage according to a retention time.

Referring to FIGS. 9, 18, and 19, the read voltage determiner 230 may initially set a read voltage to the default level Vdef in order to perform a read operation on the memory cells that are programmed to have the first and second states ST1 and ST2. The default level Vdef may be a voltage level corresponding to a valley between the first and second states ST1 and ST2.

Also, the read voltage determiner 230 may determine a read voltage of the memory cells the first time t1 after the program operation is completed as the first level V1, based on a mapping table and a POS. The first level V1 may be a voltage level corresponding to a valley between the first and second states ST1 and ST2 in the first variation distribution 192.

Also, the read voltage determiner 230 may determine a read voltage of the memory cells the second time t2 after the program operation is completed as the second level V2, based on the mapping table and the POS. The second level V2 may be a voltage level corresponding to a valley between the first and second states ST1 and ST2 in the second variation distribution 193.

FIGS. 20A through 22B are diagrams for reference in sequentially explaining an operation of generating a mapping table, according an exemplary embodiment.

Figures 20A, 20B:
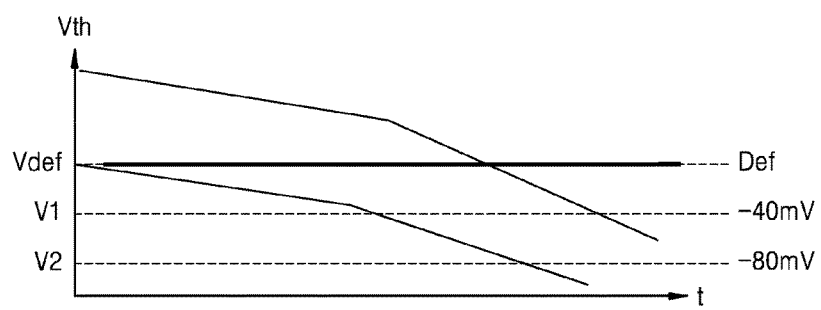
FIGS. 20A, 20B, 21A, 21B, 22A and 22B are diagrams for reference in sequentially explaining an operation of generating a mapping table, according to an exemplary embodiment.
Figures 21A, 21B:
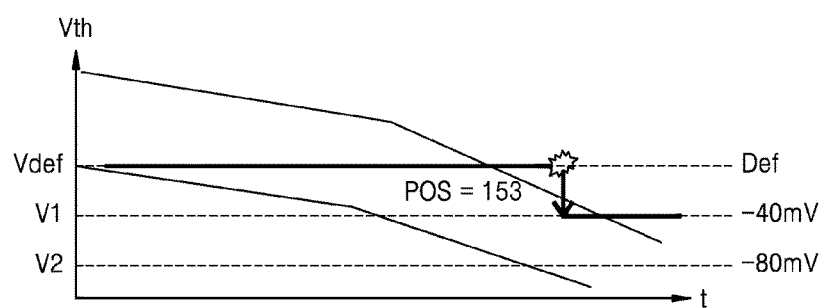
Figures 22A, 22B:
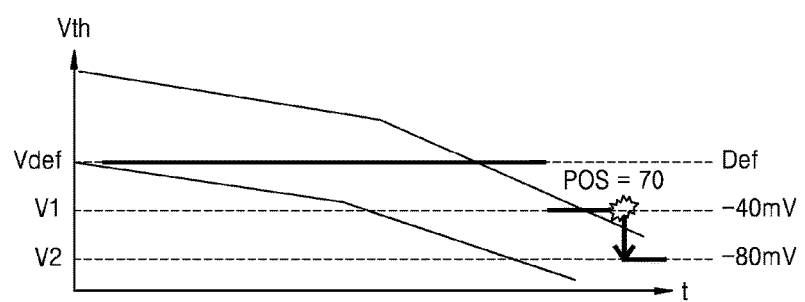

FIGS. 20A, 21A, and 22A are graphs illustrating a read level relative to time, and the horizontal axis represents time and the vertical axis represents the threshold voltage Vth. FIGS. 20B, 21B, and 22B are diagrams illustrating a mapping table respectively corresponding to FIGS. 20A, 21A, and 22A. A detailed operation of the mapping table generator 220 will now be explained in detail with reference to FIGS. 9 and 20A through 22B.

Referring to FIGS. 20A and 20B, the read voltage determiner 230 may determine the default level Vdef that is initially set before a mapping table is generated as a read voltage. Accordingly, in an initial mapping table 201, values of POSs corresponding to first and second offsets may be 0. For example, the first and second offsets may be respectively −40 mV and −80 mV.

Referring to FIGS. 21A and 21B, when a read-out fails after a read operation is performed at the default level Vdef on a first memory group, the read voltage determiner 230 may determine the first level V1 that is reduced by the first offset from the default level Vdef as a read voltage of the first memory group. When a read-out succeeds after a read operation is performed at the first level V1 on the first memory group, the mapping table generator 220 may search for a POS corresponding to the first memory group. Next, the mapping table generator 220 may determine the searched POS as the POS 'N1' corresponding to the first offset, and may store the POS 'N1' in a mapping table 211 so that the POS 'N1' corresponds to the first offset. For example, the POS 'N1' may be 153.

The read voltage determiner 230 may search for a POS corresponding to a second memory group, and may compare the searched POS with the POS N1. When the searched POS is greater than the POS N1, the read voltage determiner 230 may determine a read voltage of the second memory group as the default level Vdef. When the searched POS is equal to or less than the POS N1, the read voltage determiner 230 may determine a read voltage of the second memory group as the first level V1.

Referring to FIGS. 22A and 22B, when a read-out fails after a read operation is performed at the first level V1 on the second memory group, the read voltage determiner 230 may determine the second level V2 that is reduced by the second offset from the default level Vdef as a read voltage of the second memory group. When a read-out succeeds after a read operation is performed at the second level V2 on the second memory group, the mapping table generator 220 may determine a POS corresponding to the second memory group as the POS 'N2' corresponding to the second offset, and may store the POS 'N2' in a mapping table 221 so that the POS 'N2' corresponds to the second offset. For example, the POS 'N2' may be 70.

Figure 23:
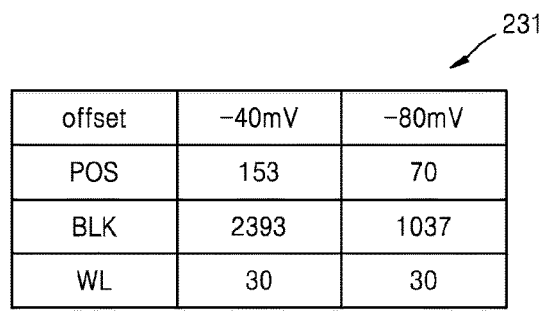
FIG. 23 is a mapping table according to another exemplary embodiment.

FIG. 23 illustrates a mapping table 231 according to another exemplary embodiment.

Referring to FIG. 23, the mapping table 231 may store a read voltage offset, a POS corresponding to the read voltage offset, an address of a memory block corresponding to the POS, and an index of a word line corresponding to the POS. In an exemplary embodiment, when memory groups are divided according to memory blocks, the mapping table 231 may store only a read voltage offset, a POS corresponding to the read voltage offset, and an address of a memory block corresponding to the POS. In another exemplary embodiment when memory groups are divided according to word lines, the mapping table 231 may store a read voltage offset, a POS corresponding to the read voltage offset, an address of a memory block corresponding to the POS, and an index of a word line corresponding to the POS.

For example, first and second read voltage offsets may be respectively −40 mV and −80 mV. The POS 'N1' corresponding to the first read voltage offset may be 153, an address of a memory block corresponding to the POS 'N1' may be 2393, and an index of a word line corresponding to the POS 'N1' may be 30. Also, the POS 'N2' corresponding to the second read voltage offset may be 70, an address of a memory block corresponding to the POS 'N2' may be 1037, and an index of a word line corresponding to the POS 'N2' may be 30.

Figure 24:
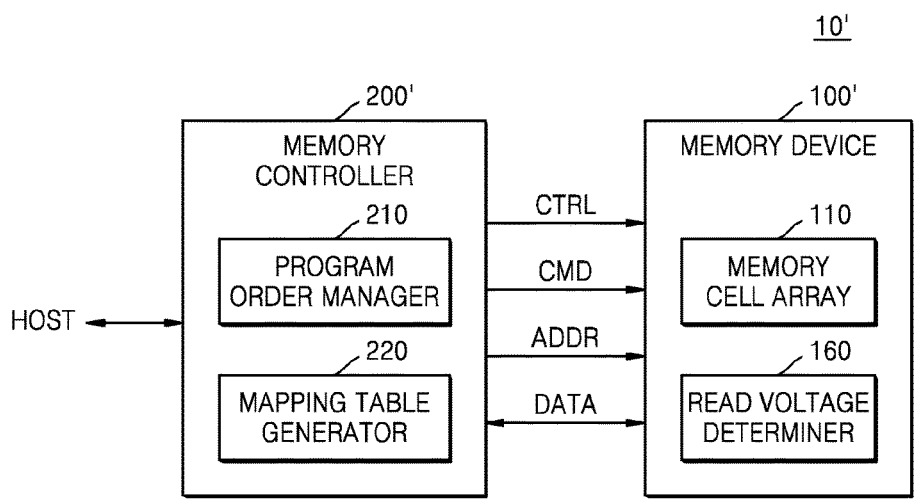
FIG. 24 is a block diagram illustrating a memory system according to another exemplary embodiment.

FIG. 24 is a block diagram illustrating a memory system 10' according to another exemplary embodiment.

Referring to FIG. 24, the memory system 10' may include a memory device 100' and a memory controller 200'. The memory controller 100' may include the memory cell array 110 and a read voltage determiner 160, and the memory controller 200' may include the program order manager 210 and the mapping table generator 220. The memory system 10' of the present exemplary embodiment is a modification of the memory system 10 of FIG. 1, and the same reference numerals denote the same elements. The following description will focus on a difference between the memory system 10' of the present exemplary embodiment and the memory system 10 of FIG. 1.

According to the present exemplary embodiment, the read voltage determiner 160 may be included in the memory device 100'. The memory cell array 110 may store program order information that is generated by the program order manager 210 and a mapping table that is generated by the mapping table generator 220. The read voltage determiner 160 may variably determine a read voltage for performing a read operation on the memory cell array 110 based on the program order information and the mapping table that are stored in the memory cell array 110.

In further detail, when a read command is received from the memory controller 200', an operation of the read voltage determiner 160 may be initiated. In detail, the read voltage determiner 160 may search for a POS corresponding to a memory group to be read from among a plurality of memory groups based on the program order information, may search for a read voltage offset corresponding to the searched POS, and may perform a read operation on the memory group by using the searched read voltage offset.

Figure 25:
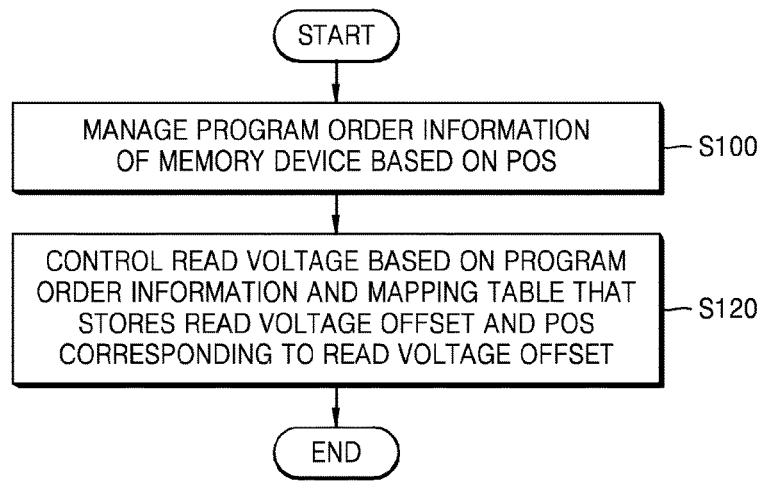
FIG. 25 is a flowchart of a method of operating a memory system, according to an exemplary embodiment.

FIG. 25 is a flowchart illustrating a method of operating a memory system, according to an exemplary embodiment.

Referring to FIG. 25, the method according to the exemplary embodiment is a method of controlling a read voltage of a plurality of memory groups according to a program order of the plurality of memory groups that are included in a memory device. The description made with reference to FIGS. 1 through 24 applies to the method of the present exemplary embodiment. The method according to the present exemplary embodiment will now be explained in detail with reference to FIGS. 1 through 25.

In operation S100, program order information of the memory device is managed based on a POS. The POS indicates a relative temporal relationship between program operations of the plurality of memory groups that are included in the memory device. The program order information is information about a correlation between POSs and the plurality of memory groups.

In an exemplary embodiment, a program order manager may sequentially store POSs according to addresses of the plurality of memory groups in order to search for the POSs according to the addresses of the plurality of memory groups. In another exemplary embodiment, the program order manager may store addresses of memory groups corresponding to POSs according to POSs that are sequentially increased in order to search for the addresses of the plurality of memory groups according to the POSs that are sequentially increased.

In operation S120, a read voltage is controlled based on the program order information and a mapping table that stores a read voltage offset and a POS corresponding to the read voltage offset.

Figure 26:
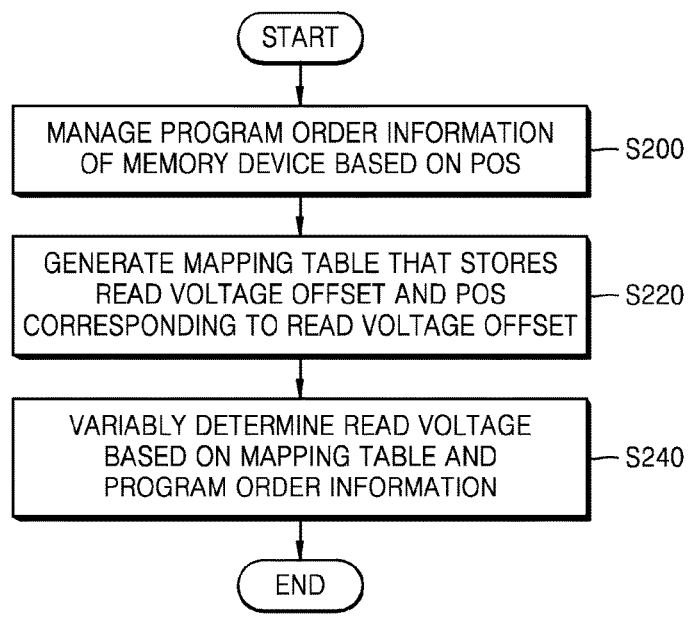
FIG. 26 is a flowchart of a method of operating a memory system, according to another exemplary embodiment.

FIG. 26 is a flowchart illustrating a method of operating a memory system, according to another exemplary embodiment.

Referring to FIG. 26, the method according to the present exemplary embodiment is a modification of the method of FIG. 25. In detail, operation S120 of FIG. 25 may be performed as operations S220 and S240 according to the present exemplary embodiment. Accordingly, the description made with reference to FIGS. 1 through 25 applies to the method according to the present exemplary embodiment. The method of the present exemplary embodiment will now be explained in detail with reference to FIGS. 1 through 26.

In operation S200, program order information of a memory device is managed based on a POS.

In operation S220, a mapping table that stores a read voltage offset and a POS corresponding to the read voltage offset is generated. The term 'read voltage offset' may be an offset in a read voltage that is initially set, that is, an offset from a default level, in order to perform a read operation on the memory device. The term 'POS corresponding to the read voltage offset' may be a POS that is allocated to a memory group whose read-out succeeds when a read operation is performed by using a read voltage to which the read voltage offset is applied.

In operation S240, a read voltage is variably determined based on the mapping table and the program order information. In detail, a read voltage determiner may search for a POS corresponding to a memory group to be read from among a plurality of memory groups based on the program order information, may search for a read voltage offset corresponding to the searched POS, and may perform a read operation on the memory group by using the searched read voltage offset.

Figure 27:
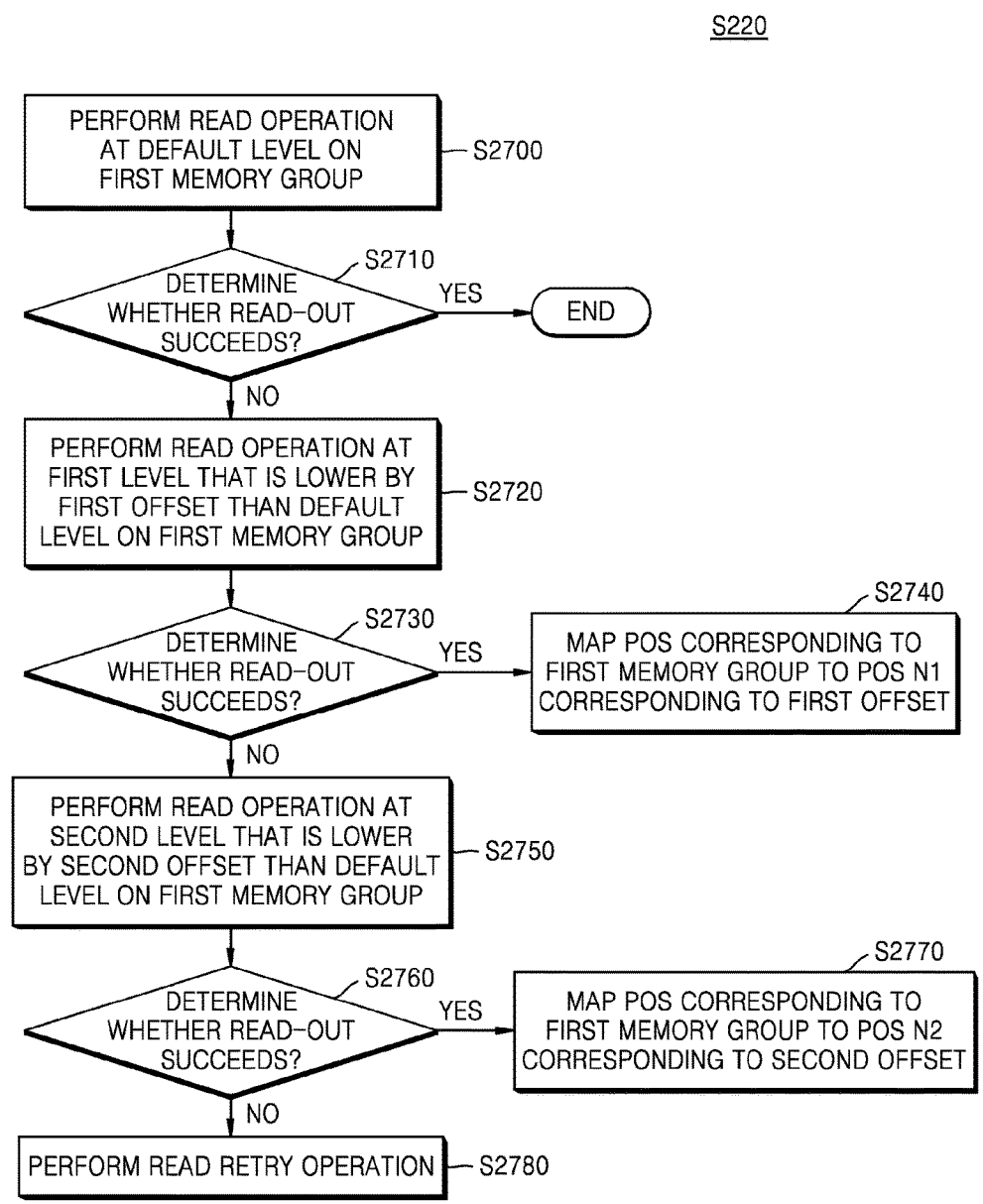
FIG. 27 is a flowchart of an operation of generating a mapping table in operation S220 of the method of FIG. 26, according to an exemplary embodiment.

FIG. 27 is a flowchart illustrating an operation of generating a mapping table in operation S220 of the method of FIG. 26, according to an exemplary embodiment.

Referring to FIG. 27, the operation of generating the mapping table according to the present exemplary embodiment may be performed by the mapping table generator 220 of FIGS. 1 and 9. The operation of generating the mapping table will now be explained in detail with reference to FIGS. 1, 9, 20A through 22B, and 27.

In operation S2700, a read operation is performed at the default level Vdef on a first memory group. The first memory group is a memory group to be read from among a plurality of memory groups. In operation S2710, it is determined whether a read-out succeeds. When it is determined in operation S2710 that the read-out succeeds, the present operation ends, and when it is determined in operation S2710 that the read-out fails, operation S2720 is performed.

In operation S2720, a read operation is performed at the first level V1 that is lower by a first offset than the default level Vdef on the first memory group. In operation S2730, it is determined whether a read-out succeeds. When it is determined in operation S2730 that the read-out succeeds, operation S2740 is performed, and when it is determined in operation S2730 that the read-out fails, operation S2750 is performed. In operation S2740, a POS corresponding to the first memory group is mapped to the POS N1 corresponding to the first offset.

In operation S2750, a read operation is performed at the second level V2 that is lower by a second offset than the default level Vdef on the first memory group. A magnitude of the second offset is greater than a magnitude of the first offset. In operation S2760, it is determined whether a read-out succeeds. When it is determined in operation S2760 that the read-out succeeds, operation S2770 is performed, and when it is determined in operation S2760 that the read-out fails, operation S2780 is performed. In operation S2770, the POS corresponding to the first memory group is mapped to the POS N2 corresponding to the second offset.

In operation S2780, a read retry operation is performed. In detail, a flag may be set so that a result obtained after performing the read operation on the first memory group is not used to update a mapping table, and a read retry operation for searching for a valley between two adjacent distributions may be performed on the first memory group.

Figure 28:
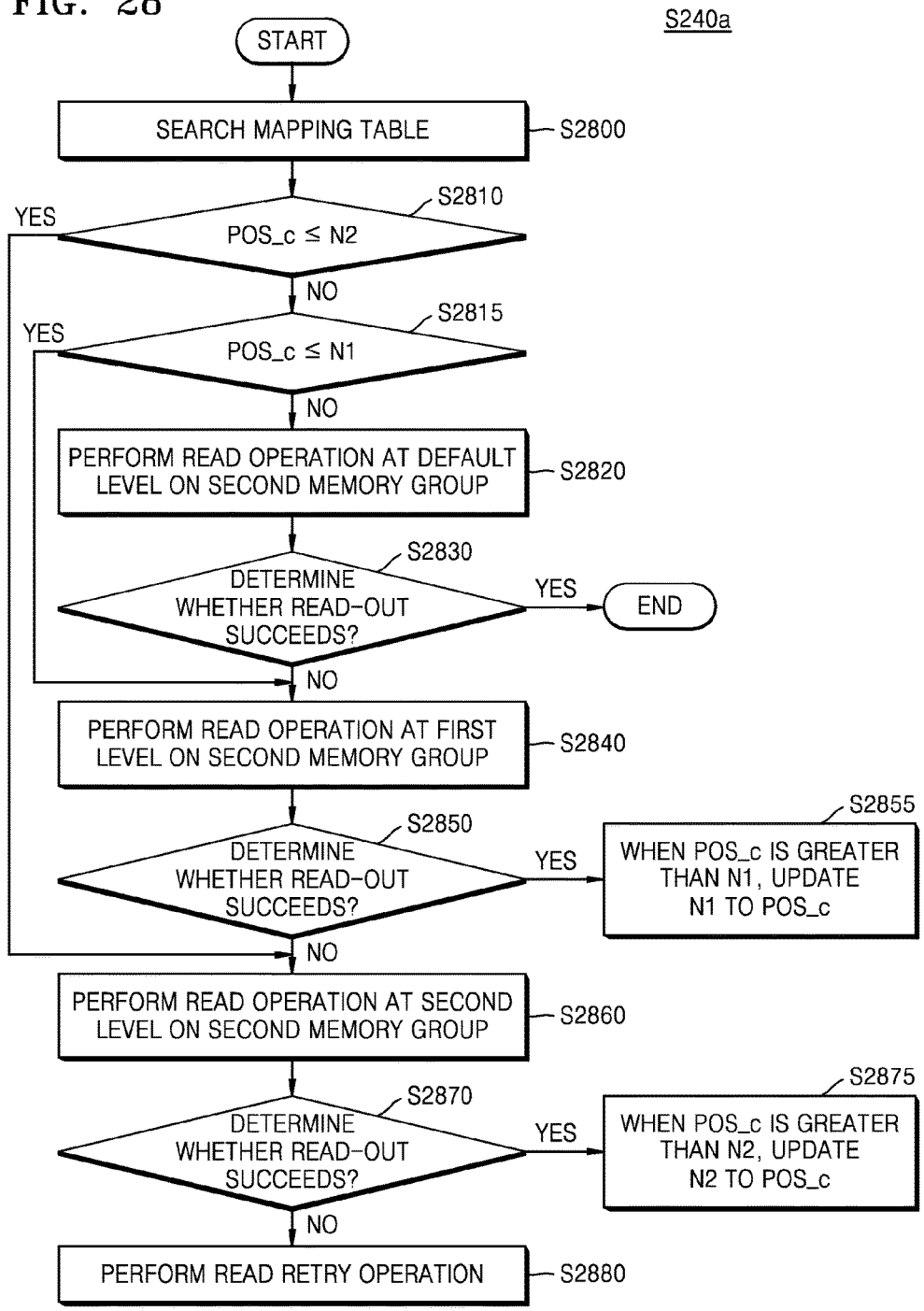
FIG. 28 is a flowchart of an operation of determining a read voltage in operation S240 of the method of FIG. 26, according to an exemplary embodiment.

FIG. 28 is a flowchart illustrating an operation of determining a read voltage in operation S240 of the method of FIG. 26, according to an exemplary embodiment.

Referring to FIG. 28, the operation of determining the read voltage according to the present exemplary embodiment may be performed by the read voltage determiner 230 of FIGS. 1 and 9. The operation of determining the read voltage and an operation of updating a mapping table will now be explained in detail with reference to FIGS. 1, 9, 18, and 28.

In operation S2800, a mapping table is searched. The read voltage determiner 230 may obtain the POSs N1 and N2 respectively corresponding to first and second offsets by searching the mapping table.

In operation S2810, a current POS POS_c and the POS N2 are compared with each other. When the current POS POS_c is greater than the POS N2, operation S2815 is performed, and when the current POS POS_c is equal to or less than the POS N2, operation S2860 is performed.

In operation S2815, the current POS POS_c and the POS N1 are compared with each other. When the current POS POS_c is greater than the POS N1, operation S2820 is performed, and when the current POS POS_c is equal to or less than the POS N1, operation S2840 is performed.

In operation S2820, a read operation is performed on a second memory group at the default level Vdef. The second memory group is a memory group to be read from among a plurality of memory groups. In operation S2830, it is determined whether a read-out succeeds. When it is determined in operation S2830 that the read-out succeeds, the present operation ends, and when it is determined in operation S2830 that the read-out fails, operation S2840 is performed.

In operation S2840, a read operation is performed on the second memory group at the first level V1 that is lower by the first offset than the default level Vdef. In operation S2850, it is determined whether a read-out succeeds. When it is determined in operation S2850 that the read-out succeeds, the present operation proceeds to operation S2855, and when it is determined in operation S2850 that the read-out fails, operation S2860 is performed. In operation S2855, when the current POS POS_c is greater than the POS N1, the POS N1 is updated to the current POS POS_c.

In operation S2860, a read operation is performed on the second memory group at the second level V2 that is lower by the second offset than the default level Vdef. In operation S2870, it is determined whether a read-out succeeds. When it is determined in operation S2870 that the read-out succeeds, the present operation proceeds to operation S2875, and when it is determined in operation S2870 that the read-out fails, operation S2880 is performed. In operation S2875, when the current POS POS_c is greater than the POS N2, the POS N2 is updated to the current POS POS_c.

In operation S2880, a read retry operation is performed. In detail, a read retry operation for searching for a valley between two adjacent distributions may be performed on the memory device.

Figure 29:
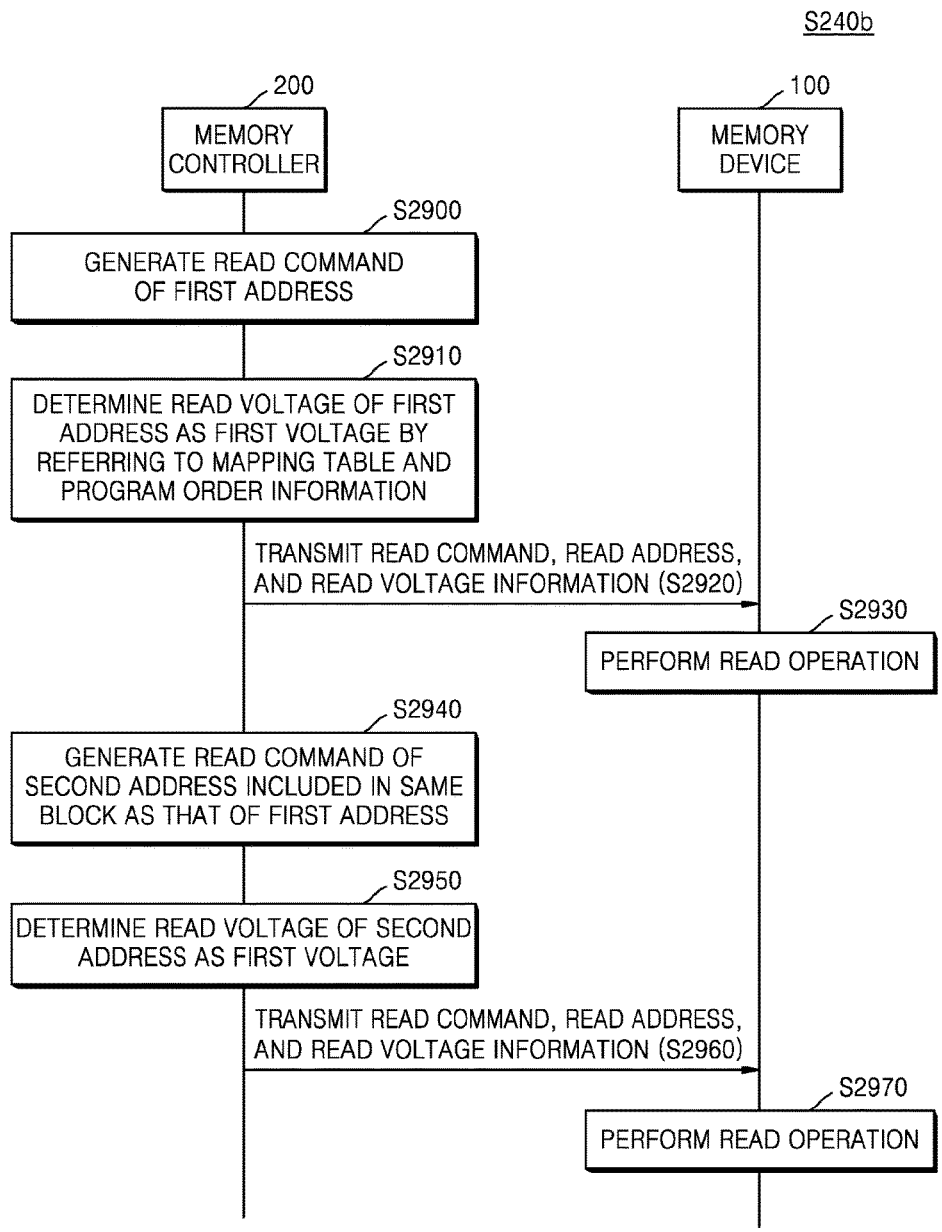
FIG. 29 is a flowchart of operations of the memory controller and the memory device in operation S240 of the method of FIG. 26, according to another exemplary embodiment.

FIG. 29 is a flowchart illustrating operations of the memory controller 200 and the memory device 100 in operation S240 of the method of FIG. 26, according to another exemplary embodiment.

Referring to FIG. 29, in operation S2900, the memory controller 200 generates a read command for a first address. In operation S2910, the memory controller 200 determines a read voltage of the first address as a first voltage by referring to a mapping table and program order information. In the present exemplary embodiment, the mapping table and the program order information may be stored according to memory blocks.

In operation S2920, the memory controller 200 transmits the read command, a read address, and read voltage information to the memory device 100. The read voltage information may be information about the first voltage. In operation S2930, the memory device 100 performs a read operation.

In operation S2940, the memory controller 200 generates a read command for a second address that is included in the same block as that of the first address. In operation S2950, the memory controller 200 determines a read voltage of the second address as the first voltage. In detail, the memory controller 200 may directly determine the read voltage of the second address as the first voltage without referring to the mapping table and the program order information. Accordingly, a time taken to determine a read voltage may be reduced, thereby further improving the performance of a memory system.

In operation S2960, the memory controller 200 transmits the read command, a read address, and read voltage information to the memory device 100. In operation S2970, the memory device 100 performs a read operation.

In another exemplary embodiment, memory groups may be divided according to word lines, and in this case, the mapping table and the program order information may be stored according to the word lines. When read operations are sequentially performed on a first page and a second page that are connected to the same word line, the memory controller 200 may determine a read voltage of the first page as a first voltage based on the mapping table and the program order information. Next, the memory controller 200 may determine a read voltage of the second page as the first voltage without referring to the mapping table and the program order information.

Figure 30:
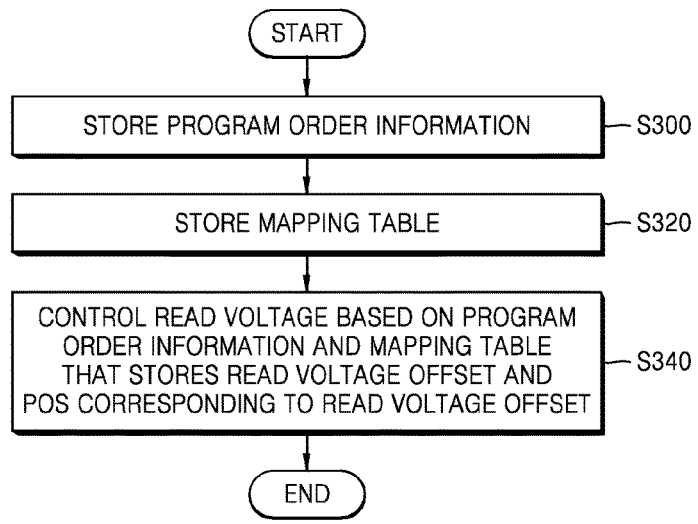
FIG. 30 is a flowchart of a method of operating a memory device, according to an exemplary embodiment.

FIG. 30 is a flowchart illustrating a method of operating a memory device, according to an exemplary embodiment.

Referring to FIG. 30, the method according to the present exemplary embodiment is a method of controlling a read voltage of a plurality of memory groups according to a program order of the plurality of memory groups that are included in the memory device, and the description made with reference to FIGS. 1 through 24 applies to the method according to the present exemplary embodiment. The method according to the present exemplary embodiment will now be explained in detail with reference to FIGS. 1 through 24 and 30.

In operation S300, program order information is stored. In detail, the memory cell array 110 may store the program order information. The program order information may be generated by the program order manager 210.

In operation S320, a mapping table is stored. In detail, the memory cell array 110 may store the mapping table. The mapping table may be generated by the mapping table generator 220 that is included in the memory controller 200. The mapping table may store a read voltage offset and a POS corresponding to the read voltage offset.

In operation S340, a read voltage is controlled based on the mapping table and the program order information. In detail, the read voltage determiner 160 may control the read voltage according to a retention time based on the mapping table and the program order information.

Figure 31:
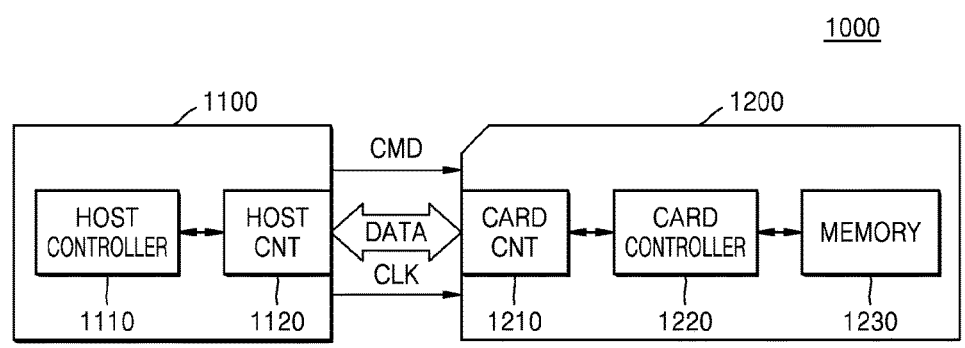
FIG. 31 is a block diagram illustrating a memory card system to which a memory system is applied, according to an exemplary embodiment.

FIG. 31 is a block diagram illustrating a memory card system 1000 to which a memory system is applied, according to an exemplary embodiment.

Referring to FIG. 31, the memory card system 1000 may include a host 1100 and a memory card 1200. The host 1100 may include a host controller 1110 and a host connector 1120. The memory card 1200 may include a card connector 1210, a card controller 1220, and a memory device 1230. In this case, the memory card 1200 may be formed by using the exemplary embodiments of FIGS. 1 through 30.

The host 1100 may write data to the memory card 1200 or may read data that is stored in the memory card 1200. The host controller 1110 may transmit a command CMD, a clock signal CLK that is generated by a clock generator (not shown) in the host 1100, and data DATA to the memory card 1200 through the host connector 1120.

The card controller 1220 may store the data DATA in the memory device 1230 in synchronization with a clock signal that is generated by a clock generator (not shown) in the card controller 1220, in response to the command CMD received through the card connector 1210. The memory device 1230 may store the data DATA that is transmitted from the host 1100.

The memory card 1200 may be a compact flash card (CFC), a microdrive, a smart media card (SMC), a multimedia card (MMC), a security digital card (SDC), a memory stick, or a USB flash memory driver.

Figure 32:
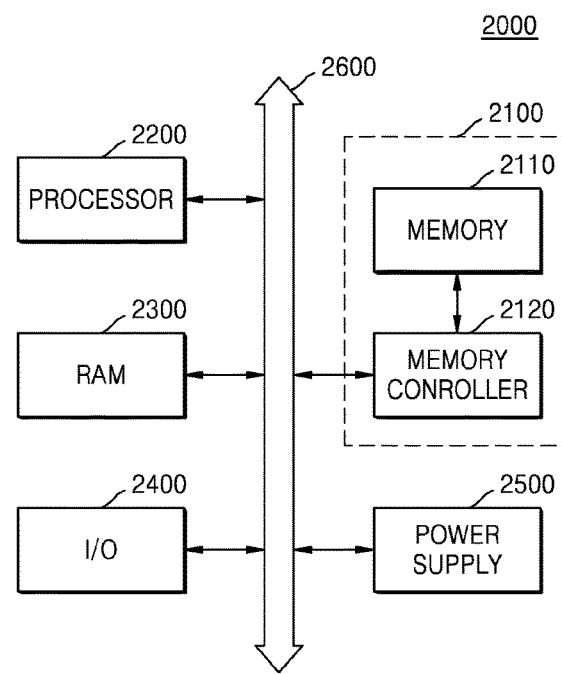
FIG. 32 is a block diagram illustrating a computing system including a memory system, according to an exemplary embodiment.

FIG. 32 is a block diagram illustrating a computing system 2000 including a memory system 2100, according to an exemplary embodiment.

Referring to FIG. 32, the computing system 2000 may include the memory system 2100, a processor 2200, a RAM 2300, an input/output device 2400, and a power supply 2500. Although not shown in FIG. 32, the computing system 2000 may further include ports that may communicate with a video card, a sound card, a memory card, a USB device, or other electronic devices. The computing system 2000 may be a personal computer, or a portable electronic device such as a laptop computer, a mobile phone, a personal digital assistant (PDA), or a camera.

The processor 2200 may perform specific calculations or tasks. According to exemplary embodiments, the processor 2200 may be a microprocessor or a CPU. The processor 2200 may communicate with the RAM 2300, the input/output device 2400, and the memory system 2100 via a bus 2600 such as an address bus, a control bus, or a data bus. In this case, the memory system 2100 may be formed by using the exemplary embodiments of FIGS. 1 through 31.

According to exemplary embodiments, the processor 2200 may be connected to an expansion bus such as a PCI bus.

The RAM 2300 may store data that is necessary to operate the computing system 2000. For example, the RAM 2300 may be a DRAM, a mobile DRAM, an SRAM, a PRAM, a ferroelectric RAM (FRAM), an RRAM, and/or an MRAM.

The input/output device 2400 may include an input unit such as a keyboard, a keypad, and/or a mouse and an output unit such as a printer and/or a display. The power device 2500 may supply an operating voltage that is necessary to operate the computing system 2000.

Figure 33:
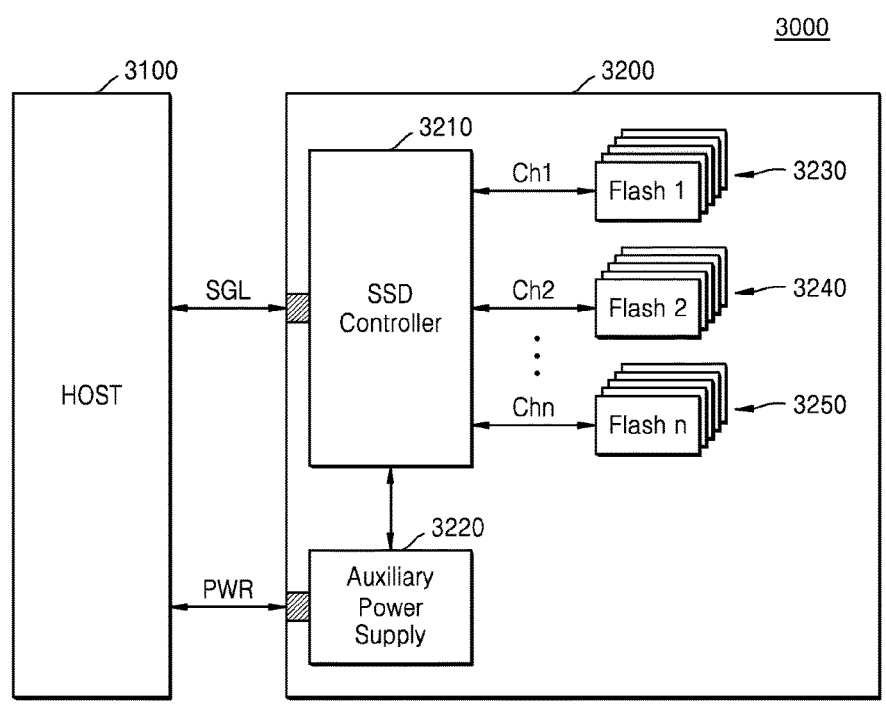
FIG. 33 is a block diagram illustrating a solid-state drive (SSD) system to which a memory system is applied, according to an exemplary embodiment.

FIG. 33 is a block diagram illustrating a solid-state drive (SSD) system 3000 to which a memory system is applied, according to an exemplary embodiment.

Referring to FIG. 33, the SSD system 3000 may include a host 3100 and an SSD 3200. The SSD 3200 transmits and receives a signal to and from the host 3100 through a signal connector, and receives power through a power connector. The SSD 3200 may include an SSD controller 3210, an auxiliary power device 3220, and a plurality of memory devices 3230, 3240, and 3250. In this case, the SSD 3200 may be formed by using the exemplary embodiments of FIGS. 1 through 32.

As described above, according to the inventive concept, since a program order of a plurality of memory groups that are included in a memory device is managed by using a POS and a read operation of the plurality of memory groups is controlled based on a mapping table that stores a read voltage offset and a POS corresponding to the read voltage offset, a read voltage level may be determined adaptively to data retention characteristics of the memory device, thereby improving the performance and reliability of a memory system.

While the inventive concept has been particularly shown and described with reference to exemplary embodiments thereof, it will be understood that various changes in form and details may be made therein without departing from the spirit and scope of the following claims.

What is claimed is:

1. A method of operating a memory system comprising a memory device, the method comprising:

managing program order information of the memory device based on a program order stamp (POS) indicating a program order of program operations of a plurality of memory groups that are included in the memory device, wherein a POS is allocated to a memory group when a program operation is performed on the memory group, the POS being maintained until a next program operation is performed on the memory group; and controlling a read voltage for performing a read operation on the memory device, based on the program order information and a mapping table that stores a read voltage offset and a POS corresponding to the read voltage offset, wherein a value of the POS allocated to the memory group is changed when the next program operation is performed on the memory group, and wherein a POS of value 1 is allocated to a memory group from among the plurality of memory groups on which a program operation is firstly performed, a POS of value 2 is allocated to a memory group on which a program operation is secondly performed, and a POS of value n is allocated to a memory group on which a program operation is nthly performed, wherein n is an integer greater than 2.

2. The method of claim 1, wherein the controlling of the read voltage comprises:

generating the mapping table that stores the read voltage offset and the POS corresponding to the read voltage offset; and variably determining the read voltage based on the mapping table and the program order information.

3. The method of claim 1, wherein the plurality of memory groups are divided according to memory blocks, a POS is allocated according to the memory blocks, and the mapping table stores the read voltage offset and the POS according to the memory blocks.

4. The method of claim 3, wherein the controlling of the read voltage comprises:

when read operations of a first address and a second address that are included in a same block are sequentially performed, determining a read voltage of the first address as a first voltage by referring to the mapping table and the program order information; and then determining a read voltage of the second address as the first voltage without referring to the mapping table and the program order information.

5. The method of claim 1, wherein the plurality of memory groups are divided according to word lines, a POS is allocated according to the word lines, and the mapping table stores the read voltage offset and the POS corresponding to the read voltage offset according to the word lines.

6. The method of claim 5, wherein the controlling of the read voltage comprises:

when read operations of a first page and a second page that are stored at a same word line are sequentially performed, determining a read voltage of the first page as a first voltage based on the mapping table and the program order information; and then determining a read voltage of the second page as the first voltage without referring to the mapping table and the program order information.

7. The method of claim 1, wherein the read voltage offset comprises at least one offset having a fixed value irrespective of the memory device.

8. The method of claim 1, wherein the read voltage offset comprises at least one offset having a value that varies according to the memory device.

9. The method of claim 1, wherein the mapping table is generated according to dies, memory blocks, word lines, pages, or data types.

10. The method of claim 1, wherein the mapping table is shared by at least two dies, at least two memory blocks, at least two word lines, at least two pages, or at least two data types.

11. The method of claim 1, wherein the memory system further comprises a memory controller,
wherein the mapping table is stored in the memory device or is temporarily stored in the memory controller, and
the program order information is stored in the memory device.

12. The method of claim 1, wherein the managing program order information comprises at least one of:
sequentially storing POSs according to addresses of the plurality of memory groups in order to search for the POSs according to the addresses of the plurality of memory groups; and
storing addresses of memory groups corresponding to POSs according to POSs that are sequentially increased in order to search for the addresses of the plurality of memory groups according to the POSs that are sequentially increased.

13. A method of operating a memory system comprising a memory device, the method comprising:
managing program order information of the memory device based on a program order stamp (POS) indicating a program order of relative temporal relationship between program operations of a plurality of memory groups that are included in the memory device; and
controlling a read voltage for performing a read operation on the memory device, based on the program order information and a mapping table that stores a read voltage offset and a POS corresponding to the read voltage offset,
wherein the controlling of the read voltage comprises
generating the mapping table that stores the read voltage offset and the POS corresponding to the read voltage offset, and
variably determining the read voltage based on the mapping table and the program order information, and
wherein the generating of the mapping table comprises
if a read-out fails after the read operation is performed at a default level on a first memory group from among the plurality of memory groups, performing the read operation at a first level that is lower by a first offset than the default level and
if the read-out succeeds after the read operation is performed at the first level, mapping a POS corresponding to the first memory group to a first POS corresponding to the first offset.

14. The method of claim 13, wherein the generating of the mapping table further comprises:
if the read-out fails after the read operation is performed at the first level on the first memory group, performing the read operation at a second level that is lower by a second offset than the default level; and
if the read-out succeeds after the read operation is performed at the second level, mapping the POS corresponding to the first memory group to a second POS corresponding to the second offset,
wherein a magnitude of the second offset is greater than a magnitude of the first offset.

15. The method of claim 13, wherein the variably determining the read voltage comprises:
comparing a current POS corresponding to a second memory group to be currently read from among the plurality of memory groups with the first POS;
if the current POS is greater than the first POS, determining a read voltage of the second memory group as the default level; and
if the current POS is not greater than the first POS, determining the read voltage of the second memory group as the first level.

16. The method of claim 15, further comprising:
if a read-out fails after the read operation is performed at the default level on the second memory group, performing the read operation on the second memory group at the first level; and
if the read-out succeeds after the read operation is performed on the second memory group at the first level, updating the first POS to the current POS.

17. The method of claim 16, further comprising:
if a read-out fails after the read operation is performed at the first level on the second memory group, performing the read operation on the second memory group at a second level that is lower by a second offset than the default level; and
if the read-out succeeds after the read operation is performed on the second memory group at the second level, updating a second POS corresponding to the second offset to the current POS.

18. The method of claim 17, wherein if the read-out fails after the read operation is performed on the second memory group at the second level, the method further comprises setting a flag so that a result of the read operation performed on the second memory group is not used to update the mapping table and performing a read retry operation for searching for a valley between two adjacent distributions of the second memory group.

19. A method of operating a memory device comprising a plurality of memory groups, the method comprising:
storing program order information comprising a program order stamp (POS) indicating a program order of program operations of the plurality of memory groups, wherein a POS is allocated to a memory group when a program operation is performed on the memory group, the POS being maintained until a next program operation is performed on the memory group;
storing a mapping table that stores a read voltage offset and a POS corresponding to the read voltage offset; and
variably determining a read voltage for performing a read operation on the plurality of memory groups based on the mapping table and the program order information,
wherein a value of the POS allocated to the memory group is changed when the next program operation is performed on the memory group, and
wherein a POS of value 1 is allocated to a memory group from among the plurality of memory groups on which a program operation is firstly performed, a POS of value 2 is allocated to a memory group on which a program operation is secondly performed, and a POS of value n is allocated to a memory group on which a program operation is nthly performed, wherein n is an integer greater than 2.

20. The method of claim 19, wherein the mapping table comprises a first POS corresponding to a first offset and a second POS corresponding to a second offset, and a magnitude of the second offset is greater than a magnitude of the first offset, wherein the variably determining the read voltage comprises:
comparing the first and second POSs with a current POS corresponding to a memory group to be currently read from among the plurality of memory groups;
if the current POS is greater than the first POS, determining the read voltage as a default level;
if the current POS is greater than the second POS and is not greater than the first POS, determining the read voltage as a first level that is lower by the first offset than the default level; and
if the current POS is not greater than the second POS, determining the read voltage as a second level that is lower by the second offset than the default level.

* * * * *